(12) United States Patent
Suzuki et al.

(10) Patent No.: US 12,414,298 B2
(45) Date of Patent: Sep. 9, 2025

(54) SEMICONDUCTOR MEMORY DEVICE

(71) Applicant: Kioxia Corporation, Tokyo (JP)

(72) Inventors: Gin Suzuki, Yokkaichi (JP); Daisuke Kawamura, Kiyosu (JP); Tomonori Sakaguchi, Yokkaichi (JP); Ikuya Saiki, Mie (JP)

(73) Assignee: Kioxia Corporation, Tokyo (JP)

( * ) Notice: Subject to any disclaimer, the term of this patent is extended or adjusted under 35 U.S.C. 154(b) by 476 days.

(21) Appl. No.: 18/063,269

(22) Filed: Dec. 8, 2022

(65) Prior Publication Data

US 2023/0422499 A1    Dec. 28, 2023

(30) Foreign Application Priority Data

Jun. 23, 2022    (JP) ................................. 2022-101253

(51) Int. Cl.
*H10B 43/27*        (2023.01)
*H01L 23/528*      (2006.01)
*H10B 43/10*        (2023.01)

(52) U.S. Cl.
CPC ......... *H10B 43/27* (2023.02); *H01L 23/5283* (2013.01); *H10B 43/10* (2023.02)

(58) Field of Classification Search
CPC ................................. H10B 43/27; H10B 43/20
See application file for complete search history.

(56) References Cited

U.S. PATENT DOCUMENTS

| | | | |
|---|---|---|---|
| 2016/0240547 A1 | 8/2016 | Tagami et al. | |
| 2021/0288061 A1* | 9/2021 | Kadota | ............. H01L 21/76805 |
| 2022/0068950 A1 | 3/2022 | Kawamura et al. | |
| 2022/0199767 A1* | 6/2022 | Lee | ......................... H01L 25/18 |

FOREIGN PATENT DOCUMENTS

JP          2022-37583 A       3/2022

* cited by examiner

*Primary Examiner* — Christopher A Johnson
(74) *Attorney, Agent, or Firm* — Oblon, McClelland, Maier & Neustadt, L.L.P.

(57) ABSTRACT

According to one embodiment, a semiconductor memory device includes a first staircase portion that is arranged in a staircase region at a position that overlaps a plate-like portion in a stacking direction, in which a plurality of conductive layers is terraced in a first direction; and a second staircase portion and a third staircase portion arranged in the staircase region on both sides in a second direction of the plate-like portion, and having structures in each of which the plurality of conductive layers is terraced, and that are mutually inverted in the second direction with respect to the plate-like portion. A plurality of first plugs is individually arranged at different positions in the second direction relative to the plate-like portion, depending on positions in the first direction, and a plurality of second plugs is individually arranged at positions inverted in the second direction from the respective positions of the plurality of first plugs, with respect to the plate-like portion.

20 Claims, 12 Drawing Sheets

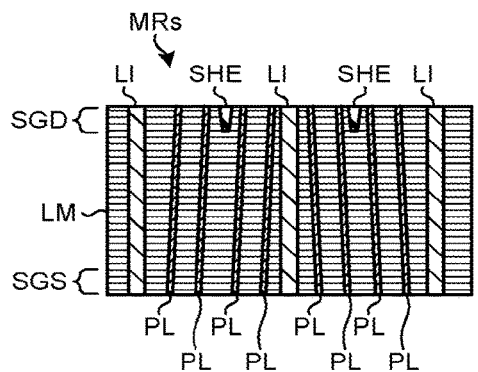
FIG.2D
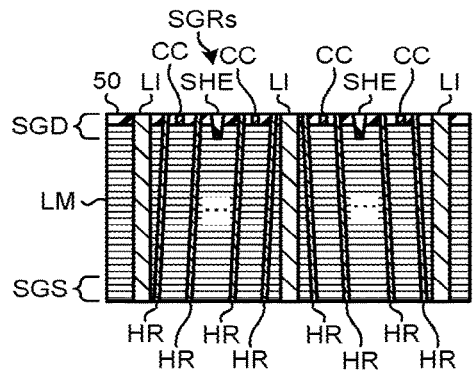
FIG.2E
FIG.2A
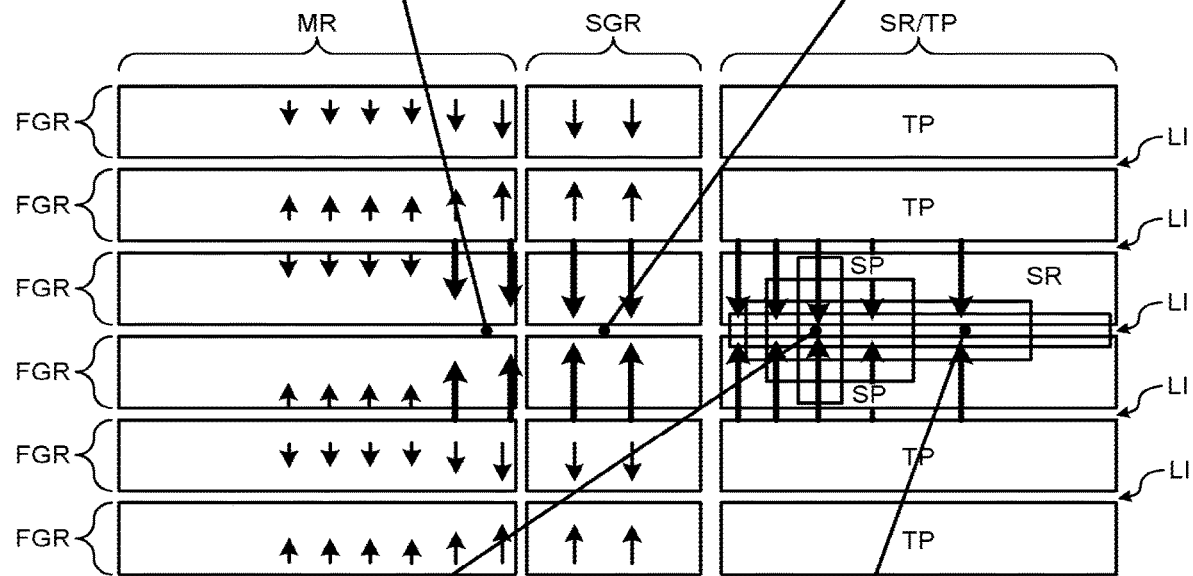
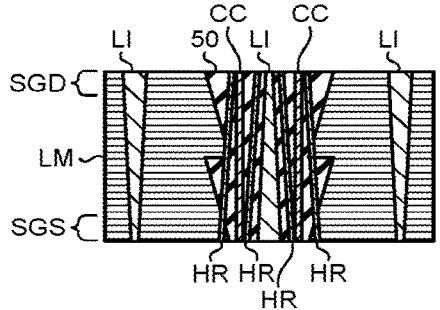
FIG.2B
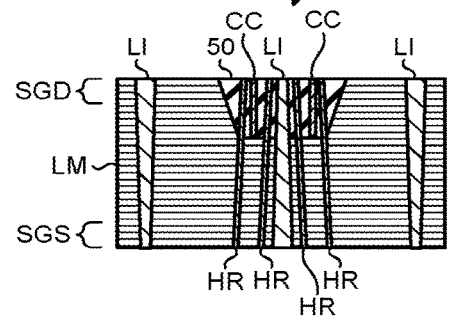
FIG.2C

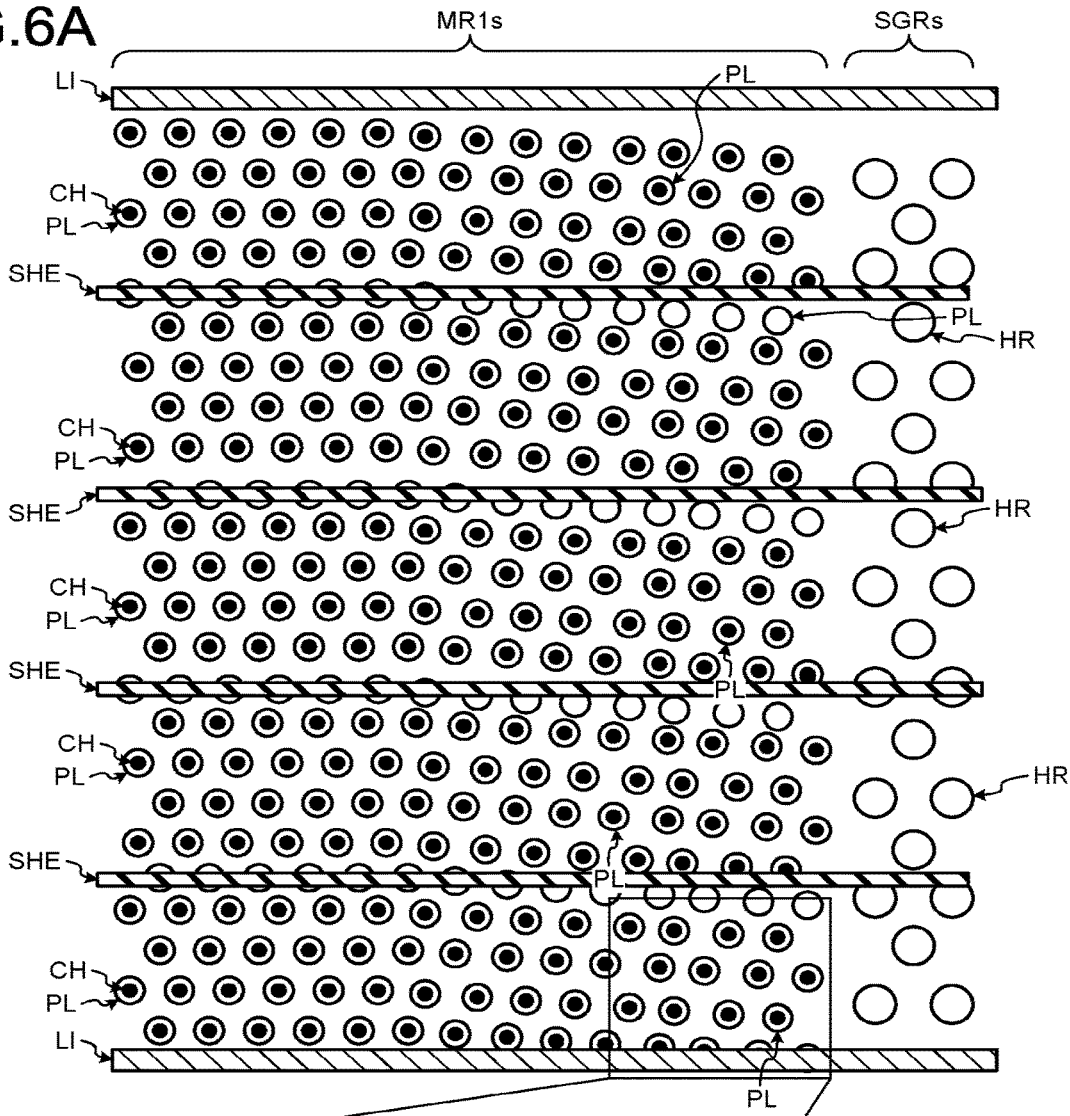
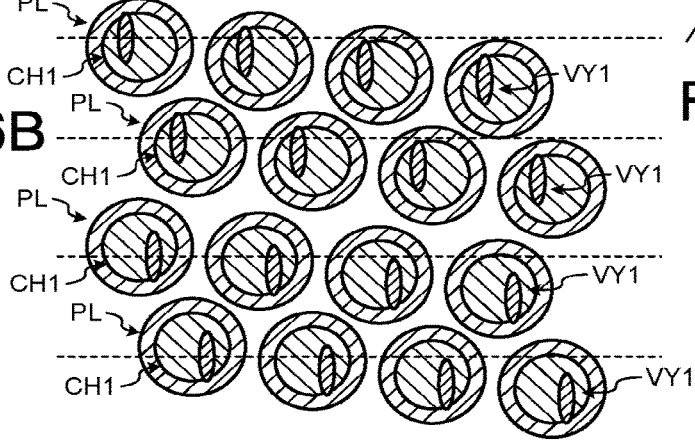
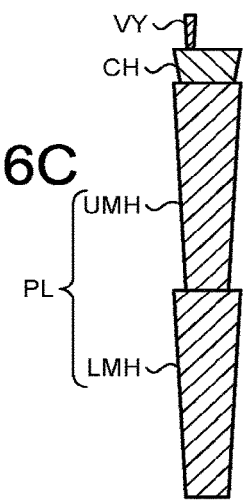

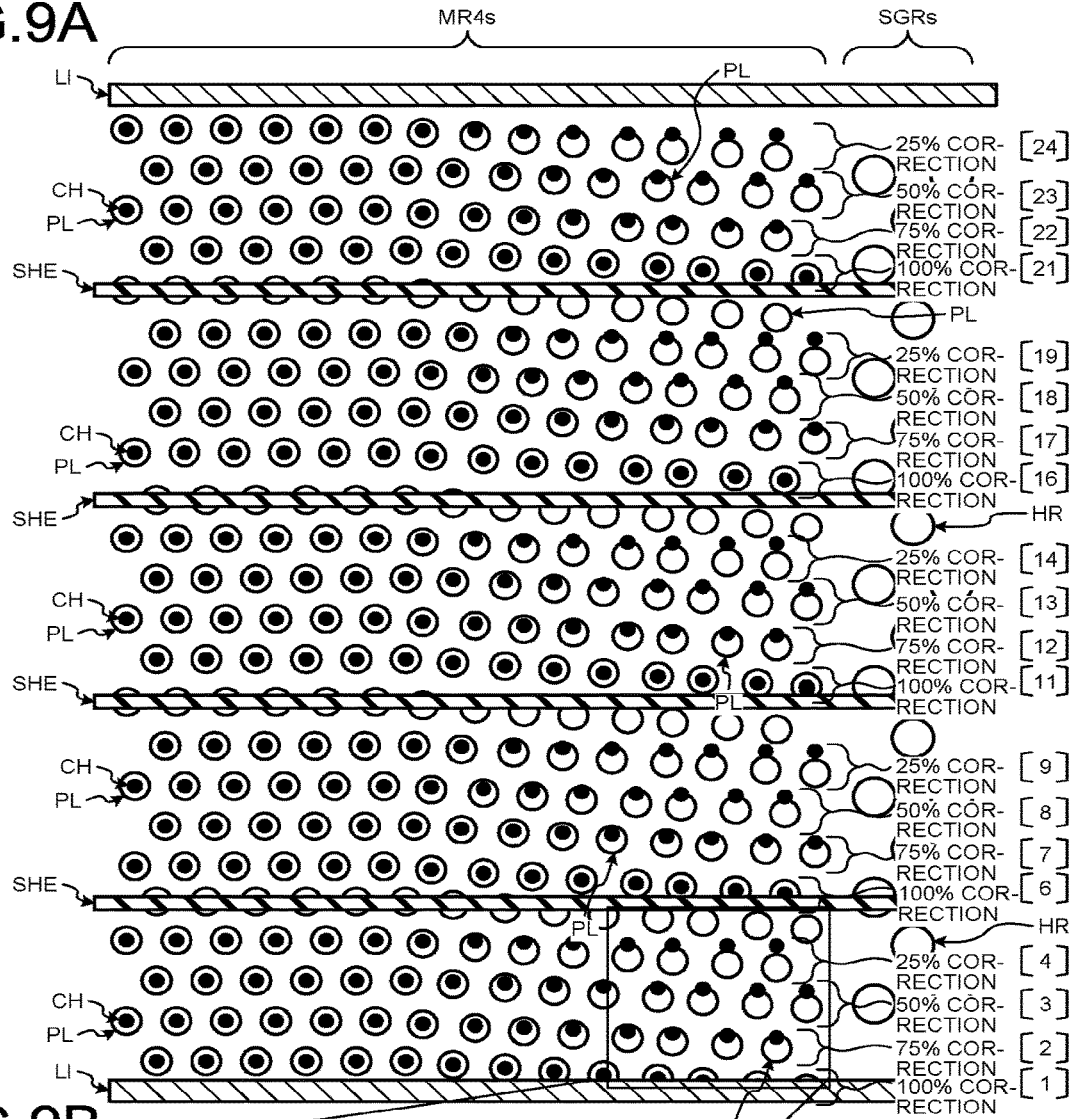
FIG.9A
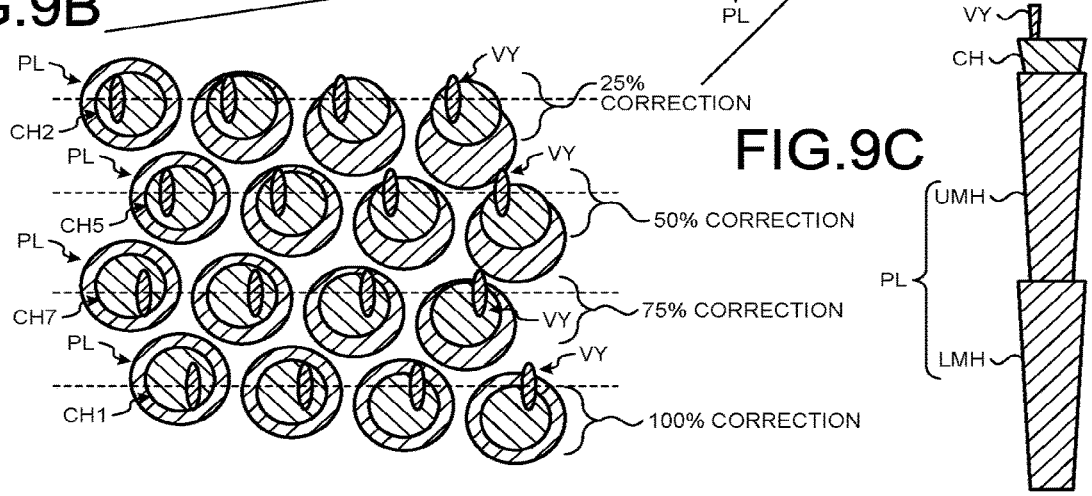
FIG.9B
FIG.9C

SEMICONDUCTOR MEMORY DEVICE

CROSS-REFERENCE TO RELATED APPLICATIONS

This application is based upon and claims the benefit of priority from Japanese Patent Application No. 2022-101253, filed on Jun. 23, 2022; the entire contents of which are incorporated herein by reference.

FIELD

Embodiments described herein relate generally to a semiconductor memory device.

BACKGROUND

Semiconductor memory device such as three-dimensional nonvolatile memory typically has a structure in which a plurality of conductive layers is stacked. This sort of stacked structure, when stressed during the manufacturing process, may occasionally cause deviation in positional relation among components in such stacked structure, up to an unacceptable level in terms of operation of the product, or quality control.

BRIEF DESCRIPTION OF THE DRAWINGS

FIGS. 2A to 2E are drawings illustrating stress possibly produced in the semiconductor memory device according to the first embodiment;

FIGS. 6A to 6C are schematic drawings illustrating an exemplary structure of a memory region of a semiconductor memory device according to a first modified example of the first embodiment;

FIGS. 9A to 9C are schematic drawings illustrating an exemplary structure of a memory region of a semiconductor memory device according to a fourth modified example of the first embodiment;

DETAILED DESCRIPTION

In general, according to one embodiment, a semiconductor memory device includes a stacked body in which a plurality of conductive layers and a plurality of insulating layers are alternately stacked one by one, and that includes a memory region and a staircase region arranged in a first direction that intersects a stacking direction of the plurality of conductive layers; a plate-like portion that extends in the stacked body in the stacking direction and in the first direction, and divides the stacked body in a second direction that intersects the stacking direction and the first direction; a first staircase portion that is arranged in the staircase region at a position that overlaps the plate-like portion in the stacking direction, in which the plurality of conductive layers is terraced in the first direction; a second staircase portion and a third staircase portion arranged in the staircase region on both sides in the second direction of the plate-like portion, and having structures in each of which the plurality of conductive layers is terraced, and that are mutually inverted in the second direction with respect to the plate-like portion; a plurality of first pillars arranged in the memory region on one side in the second direction of the plate-like portion and along the plate-like portion, and extending in the stacked body in the stacking direction; a plurality of second pillars arranged in the memory region on another side in the second direction of the plate-like portion and along the plate-like portion, and extending in the stacked body in the stacking direction; a plurality of first plugs arranged above the stacked body, and individually connected to the plurality of first pillars; and a plurality of second plugs arranged above the stacked body, and individually connected to the plurality of second pillars, wherein the plurality of first plugs is individually arranged at different positions in the second direction relative to the plate-like portion, depending on positions in the first direction, and the plurality of second plugs is individually arranged at positions inverted in the second direction from the respective positions of the plurality of first plugs, with respect to the plate-like portion.

Exemplary embodiments of this invention will be explained below in detail with reference to the accompanying drawings. The present invention is not limited by the following embodiments. Also note that constituents in the following embodiments include those that would be easily conceived by a person skilled in the art, or any constituents that are substantially the same.

First Embodiment

Hereinafter, a first embodiment will be detailed referring to the attached drawings.

(Exemplary Structure of Semiconductor Memory Device)

Figure 1A:
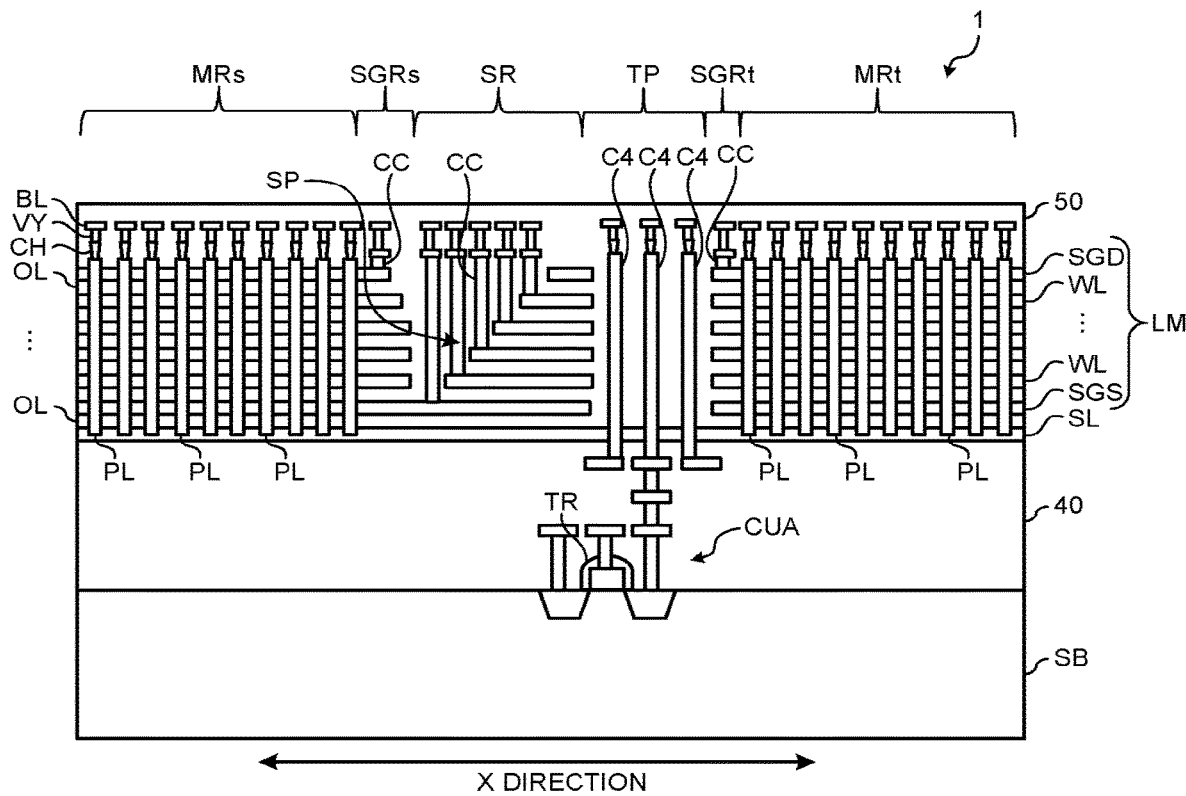
FIGS. 1A and 1B are drawings illustrating an exemplary schematic structure of a semiconductor memory device according to a first embodiment.
Figure 1B:
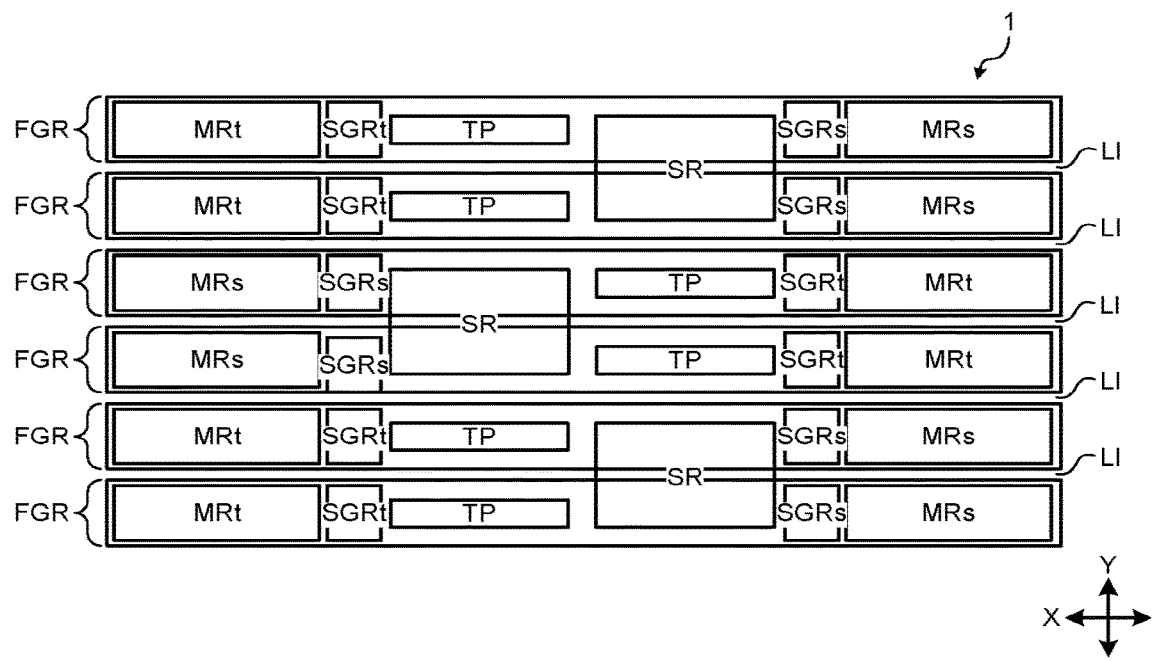

FIGS. 1A and 1B are drawings illustrating an exemplary schematic structure of a semiconductor memory device 1 according to the first embodiment. FIG. 1A is a cross-sectional view of the semiconductor memory device 1 in the X direction, and FIG. 1B is a schematic plan view illustrating a layout of the semiconductor memory device 1. FIG. 1A is presented without hatching for better visibility. FIG. 1A is also presented without some of upper wirings.

In the present specification, both the X direction and the Y direction are laid along a plane of word line WL described later, where the X direction and the Y direction are orthogonal to each other. A direction the word line WL is electrically drawn may occasionally be referred to as a "first direction", which is laid along the X direction. Meanwhile, a direction that crosses the first direction may occasionally be referred to as a "second direction", which is laid along the Y direction. Note that the first direction and the second direction are not always necessarily orthogonal to each other, due to possible manufacturing variability of the semiconductor memory device 1.

As illustrated in FIGS. 1A and 1B, the semiconductor memory device 1 has a peripheral circuit CUA, and a stacked body LM, arranged in this order on a substrate SB.

The substrate SB is typically a semiconductor substrate such as a silicon substrate. The substrate SB has, arranged thereon, the peripheral circuit CUA that contains a transistor TR, wirings and so forth. The peripheral circuit CUA contributes to operation of a memory cell described later.

The peripheral circuit CUA is covered with an insulating film 40 such as a silicon oxide film. On the insulating film 40, a source line SL is arranged. Above the source line SL, a stacked body LM is arranged. The stacked body LM has a structure in which a plurality of word lines WL and a plurality of insulating layers OL are alternately stacked. A select gate line SGD is arranged above the topmost word line WL while placing the insulating layer OL in between, meanwhile a select gate line SGS is arranged below the lowermost word line WL while placing the insulating layer OL in between.

The word line WL and the select gate lines SGD and SGS are typically tungsten layers or molybdenum layers, meanwhile the insulating layer OL is typically a silicon oxide layer.

The stacked body LM is covered with an insulating film 50. The insulating film 50 is typically a silicon oxide film. The insulating film 50 also extends to the periphery of the stacked body LM.

In the stacked body LM, there is arranged a plurality of plate-like contacts LI each penetrates the stacked body LM in the stacking direction, and extends in a direction along the X direction. The stacked body LM is thus divided in the Y direction by the plurality of plate-like contacts LI. The plurality of plate-like contacts LI is typically connected at the lower end to the source lines SL, and function as source line contacts.

Between every adjacent plate-like contacts LI, there are a plurality of memory regions MR, select gate contact regions SGR, a staircase region SR, and a through-contact region TP, arranged in line in the X direction. Such structure, having the memory regions MR, the select gate contact regions SGR, the staircase region SR, and a through-contact region TP arranged between the plate-like contacts LI neighboring in the Y direction, is typically referred to as a finger FGR.

In two fingers FGR adjoining in the Y direction, there are typically the memory region MRs, the select gate contact region SGRs, the staircase region SR, the through-contact region TP, the select gate contact region SGRt, and the memory region MRt, which are arranged in this order from one side to the other side in the X direction. In another two fingers FGR adjoining these fingers FGR in the Y direction, there are typically the memory region MRt, the select gate contact region SGRt, the through-contact region TP, the staircase region SR, the select gate contact region SGRs, and the memory region MRs, which are arranged in this order from one side to the other side in the X direction.

The semiconductor memory device 1 thus follows a pattern in which four fingers FGR arranged in the Y direction forms a minimum unit to be repeated periodically in the Y direction.

Note that, for the convenience of distinguishing the plurality of memory regions MR and the plurality of select gate contact regions SGR arranged in the X direction, those neighboring the staircase region SR without placing the through-contact region TP in between are denoted as the memory region MRs and the select gate contact region SGRs. Meanwhile, those arranged in line with the staircase region SR in the X direction, while placing the through-contact region TP in between are denoted as the memory region MRt and the select gate contact region SGRt. Simple notations such as memory region MR and select gate contact region SGR will suffice, if the discrimination is not necessary.

The memory region MR has arranged therein a plurality of pillars PL, each penetrating the stacked body LM in the stacking direction. Each pillar PL has a multi-layered structure called MANOS (metal-alumina-nitride-oxide-silicon) structure. A plurality of memory cells is formed at the intersections of the pillars PL with the word lines WL. Hence, the semiconductor memory device 1 is typically structured as a three-dimensional nonvolatile memory in which the memory cells are arranged three-dimensionally in the memory region MR.

The staircase region SR has a plurality of staircase portions SP in which the plurality of word lines WL is terraced downwards in the stacking direction to give a shape referred to as valley-like shape at least in the Y direction. Each step of the staircase portion SP is constituted typically by the word line WL in each layer. The word line WL in each layer establishes electrical conduction on both sides in the X direction while placing the staircase region SR in between, through one side in the Y direction of the staircase region SR. At a terrace portion in each step of the staircase portion SP, there is arranged a contact CC that is connected to the word line WL in each layer. These contacts CC are electrically connected, through the upper wirings and so forth of the stacked body LM, to a peripheral circuit CUA.

This enables leading-out of the individual word lines WL that are stacked in multiple layers. Through these contacts CC, typically write voltage and read voltage are applied to the memory cells in the memory regions MR that are arranged on both sides in the X direction, by way of the word lines WL laid at the same level of height with the memory cells.

Note in this specification that the direction, the terrace faces of the terraced word lines WL are facing, is defined as the upward direction.

In the select gate contact region SGR, one or a plurality of select gate lines SGD is terraced in the X direction. The contact CC is connected to each select gate line SGD. The contacts CC connected to the select gate lines SGD may also be arranged at both ends in the X direction of the stacked body LM.

In the through contact region TP, there are through-contacts C4 arranged so as to extend through the stacked body LM. The through-contacts C4 connect the peripheral circuit CUA arranged on the lower substrate SB, and the contacts CC of the staircase portion SP. Various types of voltage applied through the contacts CC to the memory cells are controlled by the peripheral circuit CUA, typically by way of the through-contacts C4.

The thus configured semiconductor memory device 1 has stress that would occur among various components contained in the semiconductor memory device 1.

FIGS. 2A to 2E are drawings illustrating stress possibly produced in the semiconductor memory device 1 according to the first embodiment. FIG. 2A is a plan view schematically illustrating stress possibly produced in the semiconductor memory device 1. FIGS. 2B to 2E are cross-sectional views in the Y direction, at different positions in the X direction of the semiconductor memory device 1.

As illustrated in FIGS. 2A to 2E, the semiconductor memory device 1 has the memory region MR, and the staircase region SR or the through-contact region TP arranged in line in the X direction, per the finger FGR. Between the memory region MR, and the staircase region SR or the through-contact region TP, there is arranged the select gate contact region SGR.

In the select gate contact region SGR, one or a plurality of select gate lines SGD is terraced in the X direction, and the contact CC connects to each of the select gate lines SGD. The staircase region SR has a staircase portion SP in which the plurality of word lines WL, and select gate lines SGD and SGS are terraced, and the contact CC connects to each of the word lines WL and the select gate lines SGS.

In the staircase region SR and the select gate contact region SGR, also arranged are columnar portions HR. Each columnar portion HR extends through the stacked body LM in the stacking direction of the stacked body LM, to support the stacked body LM during a manufacturing process of the semiconductor memory device 1 described later. The columnar portion HR arranged in the staircase region SR is solely composed of an insulating layer such as a silicon oxide layer. The columnar portion HR arranged in the select gate contact region SGR has a MANOS structure, similarly for example to the pillar PL.

The plurality of columnar portions HR is also arranged in the through-contact region TP, although not illustrated. The columnar portion HR arranged in the through-contact region TP typically has the MANOS structure, similarly to the columnar portion HR in the select gate contact region SGR.

The staircase region SR has a plane bottomed valley-like shape surrounded, steep on both sides in the Y direction and one side in the X direction and moderate on the other side in the X direction, by the staircase part in which the plurality of word lines WL and the select gate lines SGD and SGS are terraced. That is, the staircase part on both sides in the X direction face each other in the X direction, and descend towards the mutual sides. Meanwhile, the staircase part on both sides in the Y direction face each other in the Y direction, and descend towards the mutual sides. The valley-like shape region is filled with the insulating film 50, at least up to a level of height of the stacked body LM.

Of the staircase part on both sides in the X direction, the staircase part arranged on the side away from the memory region MR and from the select gate contact region SGR constitutes the staircase portion SP. In the staircase region SR, a plate-like contact LI is arranged so as to divide the staircase region SR in the Y direction, at a position that overlaps the stacking direction of the stacked body LM. Also the staircase portion SP is divided by the plate-like contact LI in the Y direction. Hence, a single staircase region SR contains two staircase portions SP arranged on both sides in the Y direction across the plate-like contact LI.

Of the staircase part on both sides in the X direction, the staircase part arranged on the side closer to memory region MR and to the select gate contact region SGR constitutes a dummy staircase portion in which the contact CC is not arranged. The dummy staircase portion is typically constituted by the terraced word lines WL, and has a terrace face narrower than in the staircase portion SP, and a staircase length shorter than in the staircase portion SP.

Now, the staircase length of each staircase part is a length from the uppermost step to the lowermost step of the staircase part. The staircase length may include a bottom portion located below the lowermost step of these staircase parts.

The staircase parts on both sides in the Y direction are dummy staircase portions in which the contact CC is not arranged, similarly to the dummy staircase portion facing the staircase portion SP in the X direction. Also the dummy staircase portions on both sides in the Y direction are typically constituted by the terraced word lines WL, and has a terrace face narrower than in the staircase portion SP, and a staircase length shorter than in the staircase portion SP. The staircase lengths of these dummy staircase portions are different depending on the position in the X direction.

More specifically, the staircase length of the dummy staircase portions on both sides in the Y direction is shorter, at a position adjacent to the portions where the upper word lines WL and so forth of the staircase part on both sides in the X direction are terraced, meanwhile the staircase length of the dummy staircase portions on both sides in the Y direction is longer, at a position adjacent to the portions where the lower word lines WL and so forth of the staircase part on both sides in the X direction are terraced. For example, the staircase length of the dummy staircase portions on both sides in the Y direction becomes longest, at a position where the select gate line SGS in the lowermost layer of the staircase part on both sides in the X direction is terraced.

Hence, at a portion where the select gate line SGS in the lowermost layer is terraced, the width in the Y direction of the staircase parts on both sides in the Y direction becomes maximum.

The dummy staircase portions opposed in the Y direction are mutually divided by the plate-like contact LI that isolates the staircase region SR in the Y direction. These dummy staircase portions have a mutually inverted structure in the Y direction with respect to the plate-like contact LI. That is, the dummy staircase portions on both sides in the Y direction of the plate-like contact LI have a substantially line-symmetric structure with respect to the plate-like contact LI.

Note that, in this specification, notation with use of substantially line symmetric, substantially linear, substantially equal, substantially aligned, substantially constant or the like includes not only cases of being completely line symmetric, linear, equal, matched, constant or the like, but also cases of being line symmetric, linear, equal, aligned, constant or the like, within an acceptable range of manufacturing variabilities of the semiconductor memory device 1.

With a plurality of staircase parts being arranged as described above, the region surrounded by these staircase parts has a shape referred to as valley-like shape, having a moderate staircase portion SP in one direction, and steep staircase parts in the other directions.

Now, the stacked body LM typically has a two-tier structure in which sacrificial layers that correspond to the plurality of word lines WL, and a plurality of insulating layers OL and so forth are stacked in two division. In the stacked body LM having the two-tier structure, also the staircase portion SP and the dummy staircase portion are formed in two division. In this case, in view of minimizing the staircase length of the dummy staircase portions that do not contribute to functions of the semiconductor memory device 1, the dummy staircase portions in the upper and lower tiers are formed to overlap in the stacking direction of the stacked body LM.

FIG. 2B is a cross-sectional view in the Y direction, illustrating a portion where the word line WL or the select gate line SGS in the lowermost layer of the staircase portion SP is terraced. A part of the staircase portion SP illustrated in FIG. 2B corresponds to the deepest part of the valley-like shape of the staircase region SR, where also the thickness of the insulating film 50 filled in the valley-like shape becomes maximum. The deepest part of the valley-like shape is also a portion where the width in the Y direction of the dummy staircase portions on both sides in the Y direction becomes maximum, and where also the width of the insulating film 50 becomes maximum.

Now, the stacked body LM in which a plurality of different types of layers is stacked in multiple layers, and the insulating film 50 having a relatively large volume, may have produced therein different sorts of stress. The stacked body LM is formed typically by stacking a plurality of sacrificial layers such as a silicon nitride layer and a plurality of insulating layers OL, and then by replacing the sacrificial layers with conductive layers to form the word lines WL. Difference of the stresses between the stacked body LM and the insulating film 50 becomes distinctive, in the process of such replacement.

Hence, in a part of the staircase portion SP illustrated in FIG. 2B, the plate-like contact LI that divides the staircase region SR in the Y direction tends to have a tapered shape with a compressed upper end and swollen lower end, due to stress that emerges during the replacement for forming the stacked body LM. On the other hand, the plate-like contacts LI neighboring both ends in the Y direction of the plate-like contact LI, are arranged in the stacked body LM, and therefore tends to have a tapered shape with a swollen upper end and compressed lower end.

Again in a part of the staircase portion SP illustrated in FIG. 2B, the upper parts of the columnar portions HR tend to be attracted towards the plate-like contact LI that divides the staircase region SR in the Y direction, due to stress that emerges during the replacement for forming the stacked body LM, making the columnar portions HR more likely to incline towards the plate-like contact LI. In contrast, the contacts CC are formed typically after the replacement for forming the stacked body LM, without being affected by the stress during the replacement for forming the stacked body LM, and can therefore extend in the insulating film 50 substantially vertically.

Note that FIG. 2B illustrates only the columnar portions HR arranged in the vicinity of the plate-like contact LI that divides the staircase region SR in the Y direction. The columnar portions HR are, however, dispersedly arranged over the entire staircase region SR.

FIG. 2C is a cross-sectional view in the Y direction, illustrating a portion where the word lines WL in the middle layer of the staircase portion SP are terraced. In a part of the staircase portion SP illustrated in FIG. 2C, the valley-like shape in the staircase region SR is shallower than in the part of the staircase portion SP illustrated in FIG. 2B, and the width of the valley-like shape in the Y direction is narrower than in the part of the staircase portion SP illustrated in FIG. 2B. In this part, also the insulating film 50 becomes thinner and narrower, than in the part of the staircase portion SP illustrated in FIG. 2B.

Hence, in the part of the staircase portion SP illustrated in FIG. 2C, the difference of the stresses between the stacked body LM and the insulating film 50, that emerges during the replacement for forming the stacked body LM, is smaller than in the part illustrated in FIG. 2B. In this part, also the inclination of the columnar portion HR towards the plate-like contact LI that divides the staircase region SR in the Y direction, is moderated than that of the columnar portions HR in the part of the staircase portion SP illustrated in FIG. 2B.

Note that also FIG. 2C illustrates only the columnar portions HR arranged in the vicinity of the plate-like contact LI that divides the staircase region SR in the Y direction.

The aforementioned difference of the stresses between the stacked body LM and the insulating film 50, which emerges during the replacement for forming the stacked body LM, can also affect the memory region MR and the select gate contact region SGR. FIG. 2A uses arrows to indicate magnitude and direction of the stress exerted on the memory region MR and the select gate contact region SGR As illustrated in FIG. 2A, in the memory region MRs and the select gate contact region SGRs neighboring the staircase region SR without placing the through-contact region TP in between, the memory region MRs and the select gate contact region SGRs are subjected to the stress that acts towards the plate-like contact LI that divides the staircase region SR in the Y direction. Moreover, the select gate contact region SGRs, positioned closer to the staircase region SR than the memory region MRs, may be more largely affected by such stress. In the memory region MRs, the aforementioned influence of the stress appears more distinctive, as the position comes closer to the staircase region SR.

For this reason, also the pillars PL and the columnar portions HR, respectively arranged in the memory region MRs and the select gate contact region SGRs, may incline towards the plate-like contact LI that divides the staircase region SR in the Y direction.

FIG. 2D is a cross-sectional view taken in the Y direction, at the memory region MRs closer to the staircase region SR. As illustrated in FIG. 2D, in the memory region MR (MRs, MRt), isolation layers SHE extend substantially in a direction along the X direction, so as to isolate the upper portion of the stacked body LM between the plate-like contacts LI neighboring in the Y direction, into a plurality of sections of the select gate lines SGD. Each isolation layer SHE extends from the memory region MR (MRs, MRt) to the select gate contact region SGR (SGRs, SGRt), and reaches the staircase region SR or the through-contact region TP neighboring the select gate contact region SGR.

In addition, the portion of the memory region MRs illustrated in FIG. 2D comes under relatively large stress, during the replacement for forming the stacked body LM, as compared for example with a portion away in the X direction from the staircase region SR. Hence, the pillars PL arranged in this portion of the memory region MRs tend to cause relatively large inclination towards the plate-like contacts LI that divide the staircase region SR in the Y direction.

FIG. 2E is a cross-sectional view taken in the Y direction at the select gate contact region SGRs. In the select gate contact region SGRs neighboring the staircase region SR in the X direction, the stress during the replacement for forming the stacked body LM is more strongly exerted. Hence, the columnar portions HR arranged in the select gate contact region SGRs tend to more largely incline towards the plate-like contacts LI that divide the staircase region SR in the Y direction.

Note in the select gate contact region SGR, the upper portion of the stacked body LM is isolated into a plurality of sections of the select gate lines SGD by the isolation layers SHE, and such individual sections of the select gate lines SGD have arranged therein the contacts CC that are connected to these select gate lines SGD.

While FIG. 2E illustrates several columnar portions HR arranged in each of the sections isolated by one isolation layer SHE, the plurality of columnar portions HR is also arranged in the select gate contact region SGR in an entirely distributed manner.

Also in the memory region MR and the select gate contact region SGR neighboring the staircase region SR in the X direction while placing the through-contact region TP in between (the memory region MRt and the select gate contact region SGRt in FIG. 1), the memory region MRt and the select gate contact region SGRt are subjected to the stress that acts towards the plate-like contact LI that divides the staircase region SR in the Y direction.

Also in a case where the through-contact region TP is arranged in between, the select gate contact region SGRt, which is closer to the staircase region SR than the memory region MRt, will be more distinctly affected by such stress. Meanwhile in the memory region MRt, such influence of the stress becomes more distinctive as the position comes closer to the staircase region SR.

Hence, also in these memory region MRt and the select gate contact region SGRt, the pillars PL and the columnar portions HR tend to incline towards the plate-like contact LI that divides the staircase region SR arranged in the X direction while placing the through-contact region TP in between, depending on the magnitude of the stress, that is, the distance in the X direction from the staircase region SR.

Note however that the influence of such stress is smaller than in the memory region MRs and the select gate contact region SGRs neighboring the staircase region SR in the X direction, without placing the through-contact region TP in between.

Figure 3A:
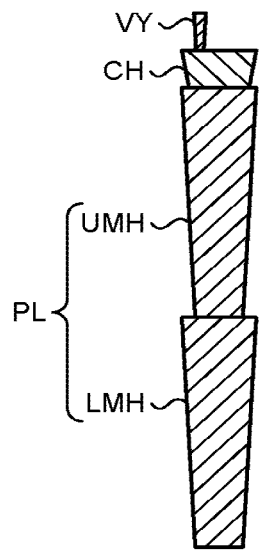
FIGS. 3A and 3B are schematic drawings illustrating an exemplary structure of a memory region and a select gate contact region of the semiconductor memory device according to the first embodiment.
Figure 3B:
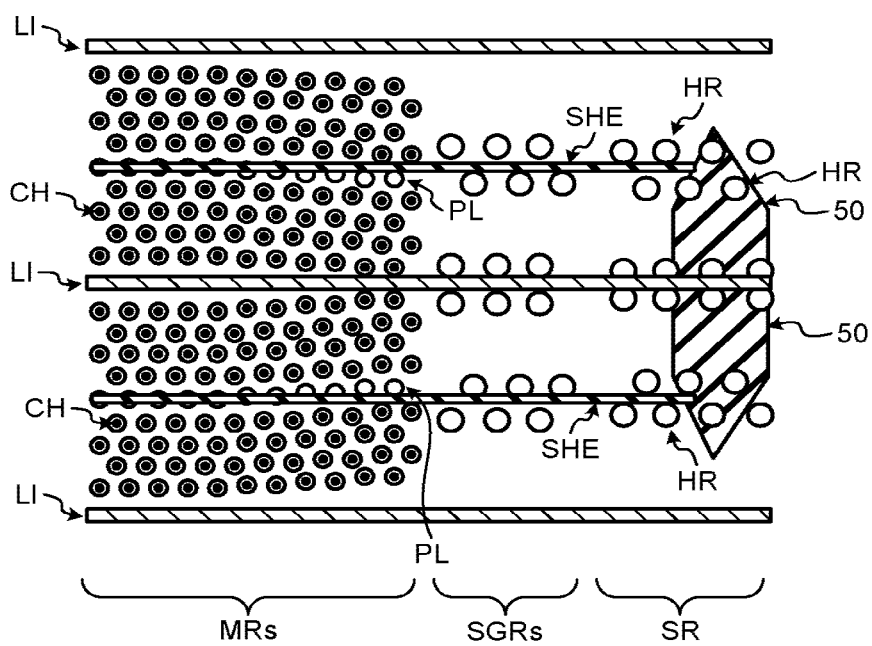
Figure 4:
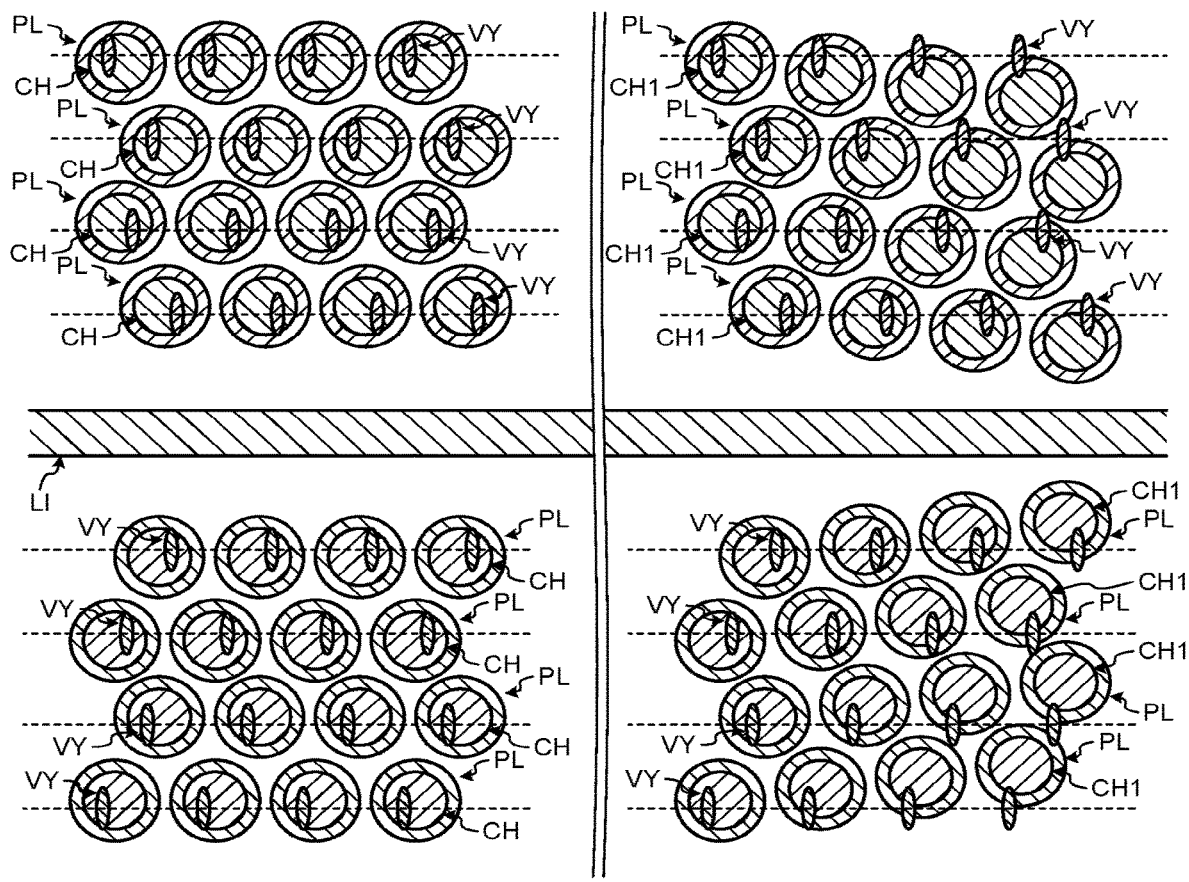
FIG. 4 is a schematic drawing illustrating an exemplary structure of a memory region of the semiconductor memory device according to the first embodiment.

FIGS. 3A to 4 illustrate a detailed structure of the memory region MRs under such influence of the stress.

FIGS. 3A and 3B are schematic drawings illustrating an exemplary structure of the memory region MRs and the select gate contact region SGRs of the semiconductor memory device 1 according to the first embodiment. FIG. 3A is a cross-sectional view illustrating a detailed structure of the pillar PL. FIG. 3B is a top view that includes a part of the memory region MRs and a part of the select gate contact region SGRs.

More specifically, FIG. 3B illustrates two fingers FGR of the memory region MRs and the select gate contact regions SGRs, neighboring in the X direction the staircase region SR without the through-contact region TP arranged in between.

Note that FIG. 3B does not illustrate, for example, the upper structure that contains the plugs VY in the memory region MRs, and the contacts CC in the select gate contact region SGR. Also note that, among three plate-like contacts LI illustrated in FIG. 3B, the plate-like contact LI that overlaps, in the stacking direction of the stacked body LM, the staircase region SR neighboring the memory region MR and the select gate contact region SGR, and divides the staircase region SR in the Y direction, is also referred to as a center plate-like contact LI.

As illustrated in FIG. 3A, in the stacked body LM having the two-tier structure, also the pillars PL are formed in two division. Hence, each pillar PL has a lower pillar LMH arranged in the lower part of the stacked body LM, and an upper pillar UMH arranged in the upper part of the stacked body LM and connected to the lower pillar LPL.

At the top end part of the pillar PL, there is connected a plug CH which is disposed above the stacked body LM. The pillar PL and the plug CH typically have a circular, elliptic, or oval shape, when viewed in the stacking direction of the stacked body LM.

The cross-sectional area of the plug CH, viewed in the stacking direction of the stacked body LM, may typically be smaller than the cross-sectional area of the pillar PL viewed in the stacking direction of the stacked body LM, and the plug CH may have a substantially similar form, viewed in the stacking direction of the stacked body LM, to the pillar PL.

There is a plug VY arranged further above the plug CH and connected thereto. The plug VY, when viewed in the stacking direction of the stacked body LM, typically has an elliptic shape which is more oblong in the Y direction than the pillar PL and the plug CH. The center position in the X direction of the plug VY slightly deviates typically from the center positions in the X direction of the pillar PL and the plug CH.

The pillar PL is typically connected, through these plugs CH and VY, to unillustrated bit lines BL (see FIG. 1A) arranged above the stacked body LM. Data held in the memory cells that are formed in the pillar PL is read out through the bit lines BL, to the sense amplifier contained in the peripheral circuit CUA.

As illustrated in FIG. 3B, the plurality of pillars PL is dispersedly arranged in the memory region MRs, between the plate-like contacts LI neighboring in the Y direction. The plurality of pillars PL is arranged typically in a staggered manner, when viewed in the stacking direction of the stacked body LM.

Now, the plurality of pillars PL is affected by the difference of the stresses between the stacked body LM and the insulating film 50, which occurs during the replacement for forming the stacked body LM. Hence, in some cases, the rows of the plurality of pillars PL, designed to be aligned linearly in a direction along the X direction, would approach the plate-like contact LI that divides the staircase region SR in the Y direction, that is, the center plate-like contact LI, as the position comes closer to the staircase region SR. More specifically, at least the upper pillar UMH of the pillar PL more largely inclines towards the plate-like contact LI, as the position comes closer to the staircase region SR.

Hence, the center positions in the Y direction of the individual pillars PL, aligned in a direction along the X direction, approach stepwise towards the center plate-like contact LI, as the position comes closer to the staircase region SR. Note that the center position in the Y direction of each pillar PL is defined by the center position in the Y direction of the top face of the pillar PL, regardless of inclination of the pillar PL. Also note that the top view in FIG. 3B illustrates the positions of placement of the pillars PL at the top end thereof. The same will apply to the positions of placement of the pillars PL and the columnar portions HR in the top views hereinafter.

Such rows of the plurality of pillars PL follow a mutually inverted arrangement on both sides in the Y direction of the plate-like contact LI. That is, such rows of the plurality of pillars PL are substantially line-symmetric with respect to the plate-like contact LI.

Note that FIG. 3B illustrates some pillars PL and the plugs CH placed in contact with the plate-like contact LI, for the purpose of emphasizing influence of the stress exerted on the plurality of pillars PL. The pillars PL and the plugs CH in the actual semiconductor memory device 1 are, however, arranged while keeping a predetermined distance from the plate-like contact LI, so as to avoid electrical conduction.

Between the plate-like contacts LI neighboring in the Y direction, the select gate contact region SGR and the staircase region SR have the plurality of columnar portions HR arranged therein. Now, although FIG. 3B illustrates the columnar portion HR only in the vicinity of the plate-like contact LI that divides the staircase region SR in the Y direction and the isolation layer SHE that isolates the upper portion of the stacked body LM in the Y direction, the plurality of columnar portions HR is dispersedly arranged between the plate-like contacts LI neighboring in the Y direction, according to a grid pattern or a staggered pattern, when viewed in the stacking direction of the stacked body LM.

Note that also the plurality of columnar portions HR is affected by the aforementioned difference of stress that occurs between the stacked body LM and the insulating film 50 during the replacement for forming the stacked body LM.

Hence, in some cases, the rows of the plurality of columnar portions HR, designed to be aligned linearly in a direction along the X direction, would approach the center plate-like contact LI typically in the select gate contact region SGR, as the position comes closer to the staircase region SR. More specifically, the columnar portions HR incline, at least in the upper structure thereof, more largely towards the plate-like contact LI as the position comes closer to the staircase region SR.

Also such a plurality of columnar portions HR follows a mutually inverted arrangement on both sides of the plate-like contact LI in the Y direction. That is, such rows of the plurality of columnar portions HR are substantially line-symmetric with respect to the plate-like contact LI.

Note that FIG. 3B illustrates some columnar portions HR placed in contact with the plate-like contact LI, for the purpose of emphasizing influence of the stress exerted on the plurality of columnar portions HR. The columnar portions HR having the MANOS structure in the actual semiconductor memory device 1 are, however, arranged while keeping a predetermined distance from the plate-like contacts LI, so as to avoid electrical conduction. The columnar portion HR arranged in the staircase region SR solely composed of the insulating layer, and the plate-like contact LI are, however, allowed to interfere to some extent.

Between the plate-like contacts LI neighboring in the Y direction, the memory region MR and the select gate contact region SGR have, arranged therein, the isolation layer SHE that penetrates the select gate line SGD in the upper portion of the stacked body LM.

The isolation layer SHE is typically constituted by an insulating layer that penetrates the select gate line SGD, extends through the memory region MR and the select gate contact region SGR in a direction along the X direction, to reach the staircase region SR. As described above, the isolation layer SHE penetrates, between the plate-like contacts LI neighboring in the Y direction, one or more conductive layers that contains the uppermost conductive layer of the stacked body LM, to isolate these conductive layers into a plurality of sections of the select gate lines SGD.

The isolation layer SHE may occasionally be arranged at a position that overlaps some of the pillars PL, when viewed in the stacking direction of the stacked body LM. In this case, these pillars PL will have no plugs CH and VY connected thereto, and will have no effective memory cells formed therein. Hence, the pillars PL that overlap the isolation layer SHE become dummy pillars that do not contribute to the function of the semiconductor memory device 1.

FIG. 4 is a schematic drawing illustrating an exemplary structure of the memory region MRs of the semiconductor memory device 1 according to the first embodiment.

More specifically, the upper and lower drawings on the left side of FIG. 4 are partially enlarged top views, on the side away in the X direction from the select gate contact region SGRs, of the memory region MRs illustrated in FIG. 3B, illustrating regions opposed to each other across the center plate-like contact LI.

The upper and lower drawings on the right side of FIG. 4 are partially enlarged top views on the side closer in the X direction to the select gate contact region SGRs of the memory region MRs illustrated in FIG. 3B, illustrating regions opposed to each other across the center plate-like contact LI.

As described previously, influence of the stress exerted on the pillars PL during the replacement for forming the stacked body LM decreases, as the position more largely departs from the staircase region SR in the X direction.

As illustrated on the left side of FIG. 4, for example on the side of the memory region MRs away in the X direction from the select gate contact region SGRs and the staircase region SR, the plurality of pillars PL is aligned substantially linearly in a direction along the X direction, following the design.

Moreover, on the design basis, also the plugs CH that are individually connected to the plurality of pillars PL are arranged substantially linearly, for example in a direction along the X direction. On the design basis, the center positions of the individual plugs CH are substantially aligned with the center positions of the pillars PL to be connected.

Moreover, on the design basis, also the plugs VY that are individually connected through the plugs CH to the plurality of pillars PL are arranged substantially linearly, for example in a direction along the X direction. That is, in each of the plurality of rows, the individual center positions in the Y direction of the plurality of plugs VY are aligned substantially on straight lines indicated by broken lines in FIG. 4.

Now, the center positions in the Y direction of the plurality of plugs VY deviate from the design-based center positions in the Y direction of the pillars PL, by two rows.

That is, in two rows neighboring the center plate-like contact LI, out of the plurality of rows of the plugs VY, the center positions in the Y direction of the plurality of plugs VY deviate from the design-based center positions in the Y direction of the pillars PL, in a direction approaching the plate-like contact LI. Moreover, as described previously, the center positions in the X direction of the plugs VY deviate from the design-based center positions in the X direction of the pillars PL.

On the other hand, in two rows placed away from the center plate-like contact LI, out of the plurality of rows of the plugs VY, the center positions in the Y direction of the plurality of plugs VY deviate from the design-based center positions in the Y direction of the pillars PL, in a direction departing from the plate-like contact LI. Moreover, as described previously, the center positions in the X direction of the plugs VY deviate from the design-based center positions in the X direction of the pillars PL, in the direction opposite to the plugs VY in the two rows neighboring the plate-like contact LI.

Hence, the distance between the center positions in the Y direction of the plurality of plugs VY neighboring the plate-like contact LI in the Y direction, and the center positions in the Y direction of the plurality of plugs VY in the second row in the Y direction from the plate-like contact LI, is substantially equal to the distance between the center positions in the Y direction of the plurality of plugs VY in the third and fourth rows in the Y direction from the plate-like contact LI.

On the other hand, the distance in the Y direction between the center positions in the Y direction of the plurality of plugs VY in the second and third rows in the Y direction from the plate-like contact LI, is longer than the distance between the centers in the Y direction of the plugs VY in other rows neighboring in the Y direction, such as the first and second rows, or the third and fourth rows.

Note however that, among the plurality of rows of the plugs VY, the two rows closer to the center plate-like contact LI, and the two rows more distant from the center plate-like contact LI, may only deviate so as to depart from each other in the Y direction, so that the distance in the Y direction between the two rows closer to the center plate-like contact LI, and the distance in the Y direction between the two rows more distant from the center plate-like contact LI, may be different.

Even in this case, the distance in the Y direction between the center positions in the Y direction of the plurality of plugs VY in the second and third rows in the Y direction from the plate-like contact LI, is longer than the distance between the center positions in the Y direction of the plugs VY in the first and second rows, or in the third and fourth rows.

As illustrated on the right side of FIG. 4, the pillars PL arranged in the memory region MRs and closer to the select gate contact region SGRs typically deviate from the design-based linear row under the influence of the stress, and approach the center plate-like contact LI as the position comes closer to the staircase region SR.

On the other hand, the plugs VY above the stacked body LM, which are connected through the plugs CH to the pillars PL possibly affected by the stress during the replacement for forming the stacked body LM, are not affected by such stress. Hence, the rows of the plurality of plugs VY align substantially straight, typically in a direction along the X direction, even in the regions closer to the select gate contact region SGRs and the staircase region SR. That is, in each of the plurality of rows, the individual center positions in the Y direction of the plurality of plugs VY are aligned substantially on straight lines indicated by broken lines in FIG. 4.

Like these plugs VY, also the plugs CH arranged above the stacked body LM are not susceptible to the stress during the replacement for forming the stacked body LM. Some of the plurality of plugs CH in the semiconductor memory device 1 of the first embodiment are, however, aligned while being adjusted in the Y direction in accordance with the pillars PL to be connected. FIG. 4 illustrates, on the right side thereof, plugs CH1 whose positions of placement in the Y direction are adjusted in accordance with the pillars PL.

As illustrated on the right side of FIG. 4, typically in the pillars PL having deviated towards the center plate-like contact LI, the center positions in the Y direction of the individual plugs CH1 are substantially aligned with the center positions in the Y direction of the pillars PL to be connected. Hence, the rows of the plurality of plugs CH1 aligned in a direction along the X direction more largely approach towards the center plate-like contact LI, as the position comes closer to the staircase region SR.

Also, hence, the center positions in the Y direction of the individual plugs CH1, aligned in a direction along the X direction, approach stepwise towards the plate-like contact LI relative to the center positions in the Y direction of the plugs VY to be connected, as the position comes closer to the staircase region SR.

Also, the plugs CH1 follow a mutually inverted arrangement on both sides in the Y direction across the center plate-like contact LI. That is, such rows of the plurality of plugs CH1 are substantially line-symmetric with respect to the plate-like contact LI.

Note that FIG. 4 illustrates some plugs VY placed in contact with the pillars PL not to be electrically connected with the plugs VY, for the purpose of emphasizing influence of the stress exerted on the plurality of pillars PL. The plugs VY and the pillars PL not to be connected are, however, arranged while keeping a predetermined distance in between in the actual semiconductor memory device 1, so as to avoid electrical conduction.

As described previously, when adjusting the positions in the Y direction of the plurality of plugs CH1 in accordance with the pillars PL to be connected, the positions of placement in the Y direction of the plurality of plugs CH1 may be determined typically on the basis of a stress simulation for the insulating film 50 filled in the staircase region SR and the surrounding stacked body LM. The positions of placement of the plurality of plugs CH1 in the Y direction may alternatively be determined, on the basis of actual measurement values obtained by measuring the positional deviation of the pillars PL found typically in a prototype of the semiconductor memory device 1.

FIG. 4 has explained the exemplary structure of the memory region MRs that neighbors the staircase region SR while placing the select gate contact region SGRs in between. The structure of the first embodiment is, however, also applicable to the memory region MRt that neighbors the staircase region SR, while placing the select gate contact region SGRt and the through-contact region TP in between. Since the stress in such memory region MRt is smaller than that in the memory region MRs illustrated in FIG. 4, so that the amount of correction of the plug CH1, smaller than that in FIG. 4, will suffice.

(Method for Manufacturing Semiconductor Memory Device)

Figure 5:
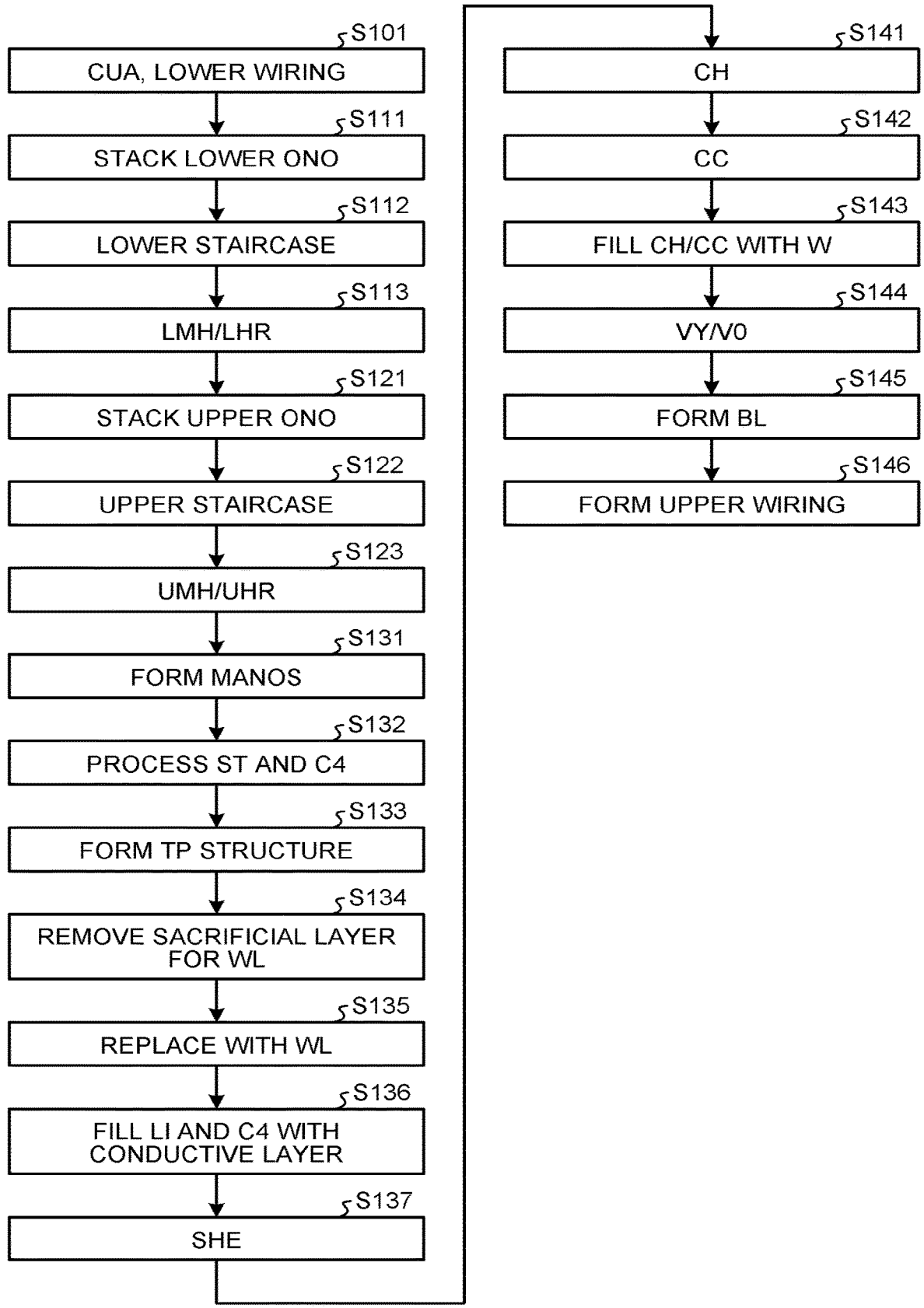
FIG. 5 is a flow chart exemplifying a part of procedures of the method for manufacturing the semiconductor memory device according to the first embodiment.

Next, a method for manufacturing the semiconductor memory device 1 according to the first embodiment will be explained referring to FIG. 5. FIG. 5 is a flow chart exemplifying a part of procedures of the method for manufacturing the semiconductor memory device 1 according to the first embodiment.

As illustrated in FIG. 5, the peripheral circuit CUA, the lower wiring and so forth are formed on a substrate SB such as a silicon substrate (step S101). The peripheral circuit CUA, the lower wirings and so forth are covered with the insulating film 40. On the insulating film 40, the source line SL is formed.

Next, a plurality of sacrificial layers such as silicon nitride layers, and a plurality of insulating layers OL are alternately stacked above the source line SL to form a lower ONO structure, thereby forming a first-tier stacked body (step S111). Also a lower staircase portion is formed in the first-tier stacked body, and the thus produced recess is filled with the insulating film 50 (step S112).

In the first-tier stacked body, also a lower pillar LMH which is a lower structure of the pillar PL, and the lower columnar portion LHR which is a lower structure of the columnar portion HR, are formed (step S113). Note, the lower pillar LMH and the lower columnar portion LHR in this stage are filled with a sacrificial layer such as an amorphous silicon layer.

Next, a plurality of sacrificial layers such as silicon nitride layers, and a plurality of insulating layers OL are alternately stacked above the first-tier stacked body to form an upper ONO structure, thereby forming a second-tier stacked body (step S121). Also an upper staircase portion is formed in the second-tier stacked body, and the thus produced recess is filled with the insulating film 50 (step S122).

Also memory holes and holes, which are converted later to the upper pillar UMH which is an upper structure of the pillar PL, and to the upper columnar portion UHR, which is an upper structure of the columnar portion HR, are respectively formed in the second-tier stacked body (step S123). Through these memory holes and the holes, the sacrificial layers having been filled in the lower pillar LMH and the lower columnar portion LHR are removed.

Next, the MANOS structure is formed in the lower pillar LMH and the upper pillar UMH, as well as in the lower columnar portion LHR and the upper columnar portion UHR of the select gate contact region SGR, thereby forming the pillars PL and the columnar portions HR (step S131). On the other hand, in the staircase region SR, there are formed the columnar portions HR having the lower columnar portion LHR and the upper columnar portion UHR filled with the insulating layer.

Next, slits ST that penetrate the stacked body having the two-tire structure, and through-holes which are converted later to through-contacts C4 are formed (step S132). Between the slits ST neighboring in the Y direction, a barrier layer is formed so as to sandwich a region where the through-contact C4 will be formed later from both sides in the Y direction, thereby reserving a region that will serve later as the through-contact region TP (step S133).

Next, a removal liquid such as hot phosphoric acid is infused through the slits ST, to remove the sacrificial layer in the stacked body (step S134). A source gas such as tungsten is introduced through the slits ST, to form the plurality of word lines WL and so forth, to a part where the sacrificial layer has been removed (step S135).

As a result of such replacement, obtainable is the stacked body LM having the two-tire structure, in which the plurality of word lines WL and the plurality of insulating layers OL are alternately stacked. Meanwhile, the region sandwiched by the barrier layer is prevented from infiltration of the removal liquid for the sacrificial layer and the source gas of tungsten or the like. Hence, the stacked body having stacked therein the plurality of sacrificial layers and the plurality of insulating layers OL may be kept intact, and will later serve as the through-contact region TP.

During the replacement, the upper end portion of the slits ST that divide the staircase region SR in the Y direction may be compressed, so that a structure that contains the pillars PL and the columnar portions HR that belong to the fingers FGR on both sides in the Y direction of the slits ST may incline towards the slits ST, while being affected by the stress.

Next, a liner layer such as an insulating layer is formed in the slits ST and the through-holes, and a conductive layer is further filled, to respectively form the plate-like contacts LI and the through-contacts C4 (step S136). Also the isolation layers SHE that extend in a direction along the X direction in the memory region MR, and reach the staircase region SR are formed (step S137). One or a plurality of select gate lines SGD is thus formed in the upper portion of the stacked body LM.

Next, holes used later for the plugs CH are formed in an upper layer above the stacked body LM (step S141). The holes herein may be formed in accordance with the pillars PL having deviated. Also the plurality of contact holes that will serve later as the contacts CC is formed in the staircase region SR and the select gate contact region SGR (step S142).

Next, a liner layer such as an insulating layer is formed in these holes and contact holes, and a conductive layer such as tungsten is further filled. The plugs CH individually connected to the plurality of pillars PL, and the contacts CC individually connected to the plurality of word lines WL and the select gate lines SGD and SGS are thus formed (step S143). These plugs CH include the plugs CH1 arranged in accordance with the deviated pillars PL.

Next, plugs VY and V0 that are connected to the plugs CH and the contacts CC, respectively, are formed in a layer further above the plugs CH (step S144). Also bit lines BL connected to the plugs VY are formed in a layer further above the plugs VY (step S145). Also upper wirings connected to the plugs V0 are formed in a layer further above the plugs V0 (step S146).

The semiconductor memory device 1 of the first embodiment is thus manufactured.

Note that the order of processes illustrated in FIG. 5 is merely an exemplary one which may be suitably modified. For example, the order of the process of step S112 and the process of step S113 is interchangeable, and also the order of the process of step S122 and the processes of steps S123 and S131 is interchangeable. Also the order of the process of step S141 and the process of step S142 may be interchanged.

In some process of manufacturing a semiconductor memory device such as a three-dimensional nonvolatile memory, the stacked body having the conductive layers and insulating layers stacked therein may be formed by replacing the sacrificial layers in the stacked body with the conductive layers. In this case, difference in stresses may emerge between the insulating layer filled in the staircase region and the surrounding stacked body, during the replacement for forming the stacked body.

Hence, in some cases, a structure including the pillars formed in the stacked body may deviate in a direction along the Y direction while being affected by the stress, and may become misaligned with a structure including the plugs formed in the upper layer over the stacked body. Correction of the positions of placement of the pillars in anticipation of the deviation by stress would, however, make the pillars interfere typically with the plate-like contacts that belong to the same layer as the pillars, and arranged on both sides in the Y direction of the staircase region.

According to the semiconductor memory device 1 of the first embodiment, the plurality of plugs CH1 is arranged on one side in the Y direction of the plate-like contact LI that divides the staircase region SR in the Y direction, along the plate-like contact LI, and individually arranged at different positions in the Y direction relative to the plate-like contact LI, depending on the positions in the X direction. Meanwhile, the plurality of plugs CH1 on the other side in the Y direction of the plate-like contact LI is arranged along the plate-like contact LI, at positions inverted in the Y direction from the respective positions of the plurality of plugs CH1 arranged on the one side of the plate-like contact LI, with respect to the plate-like contact LI.

The plurality of plugs VY herein is arranged along the plate-like contact LI, while maintaining a substantially constant distance in the Y direction from the plate-like contact LI. As a consequence, the center positions in the Y direction of the plurality of plugs CH1 are individually arranged at different positions in the Y direction relative to the center positions in the Y direction of the plugs VY to be connected.

By thus arranging the plugs CH not susceptible to the difference of stresses between the insulating film 50 filled in the staircase region SR, and the surrounding stacked body LM, in accordance with arrangement of the pillars PL which are affected by the stress, it now becomes possible to more reliably connect the plugs CH1 with the pillars PL. Such plugs CH1 can more reliably intermediate the pillars PL and the plugs VY.

According to the semiconductor memory device 1 of the first embodiment, the center positions in the Y direction of the plurality of plugs CH1 are substantially aligned with the center positions in the Y direction of the pillars PL to be connected. By thus positionally correcting the plurality of plugs CH1 by 100% relative to the pillars PL, the connection between the plug CH1 and the pillar PL becomes more reliable.

First Modified Example

Next, a semiconductor memory device according to a first modified example of the first embodiment will be explained referring to FIGS. 6A to 6C. The semiconductor memory device of the first modified example is different from the first embodiment, in that also some of the plugs VY are positionally corrected in accordance with the plugs CH1 to be connected.

FIGS. 6A to 6C are schematic drawings illustrating an exemplary structure of a memory region MR1s of the semiconductor memory device according to the first modified example of the first embodiment.

More specifically, FIG. 6A is a top view that contains a part of the memory region MR1s, and a part of the select gate contact region SGRs. While the aforementioned FIG. 3B has illustrated a simplified top view of the semiconductor memory device, FIG. 6A illustrates a more detailed top view. FIG. 6B is an enlarged top view illustrating a part, closer to the select gate contact region SGRs, of the memory region MR1s illustrated in FIG. 6A. FIG. 6C is the cross-sectional view illustrating the detailed structure of the pillar PL.

Also FIGS. 6A and 6B illustrate the memory region MR1s and the select gate contact region SGRs that neighbor in the X direction the staircase region SR without placing the through-contact region TP in between, and FIG. 6A illustrates a region corresponded to one finger FGR. That is, the staircase region SR is arranged on the right sides of FIGS. 6A and 6B.

Note that FIG. 6A does not illustrate an upper structure that contains the plugs VY in the memory region MR1s, and the contacts CC in the select gate contact region SGRs. Of the two plate-like contacts LI exemplified in FIG. 6A, the lower one in the drawing corresponds to the center plate-like contact LI that divides the staircase region SR in the Y direction. FIG. 6B is a drawing that corresponds to the drawing having been illustrated in the upper right of FIG. 4. FIG. 6B only illustrates the pillars PL, and the plugs CH1 and VY1 in the memory region MR1s.

As illustrated in FIG. 6C, also in the semiconductor memory device of the first modified example, the plug CH is connected to the pillar PL, and the plug VY with the center position slightly deviated in the X direction is connected to the plug CH, like in the aforementioned first embodiment.

Referring to the more detailed exemplary structure illustrated in FIG. 6A, the region between the plate-like contacts LI neighboring in the Y direction contains 24 rows of the pillars PL arranged in a direction along the X direction. Again in the region between the plate-like contacts LI neighboring in the Y direction, one or a plurality of conductive layers, including the uppermost conductive layer of the stacked body LM, is isolated by four isolation layers SHE into five sections of the select gate lines SGD.

Of the 24 rows of the pillars PL, those in every fifth row arranged to overlap the isolation layers SHE, are dummy pillars. Hence on the logic basis, there are 20 rows of the pillars PL contained between the plate-like contacts LI neighboring in the Y direction.

Note that such rows, for example, of the pillars PL in the memory region MR1s, and the isolation layers SHE in the memory region MR1s and in the select gate contact region SGRs, are similarly constituted also in the memory region MR and the select gate contact region SGR neighboring the through-contact region TP.

Also in the semiconductor memory device of the first modified example, the center positions in the Y direction of the pillars PL arranged in a direction along the X direction more largely approach the center plate-like contact LI, as the position comes closer to the staircase region SR, like in the aforementioned first embodiment. The plugs CH1 are typically corrected by 100% relative to the pillars PL, so that the center positions in the Y direction of the plugs CH1 are substantially aligned with the center positions in the Y direction of the pillars PL.

On the other hand, in the semiconductor memory device of the first modified example, some of the plurality of plugs VY are arranged while being adjusted in the Y direction in accordance with the plugs CH to be connected, unlike the aforementioned first embodiment. FIG. 6B illustrates the plugs VY1 whose positions of placement in the Y direction are adjusted in accordance with the plugs CH1 having been positionally corrected relative to the pillars PL.

As illustrated in FIG. 6B, typically on the plugs CH1 having been positionally corrected so as to approach the plate-like contact LI, the center positions in the Y direction of the individual plugs VY1 vary in accordance with the center positions in the Y direction of the plugs CH1 to be connected. Hence, the center positions in the Y direction of the plugs CH1 and VY1 substantially maintain positional relationship on the design basis. Meanwhile, the rows of the plurality of plugs VY1 aligned in a direction along the X direction approach towards the center plate-like contact LI more largely as the position comes closer to the staircase region SR.

Also such rows of the plurality of plugs VY1 follow a mutually inverted arrangement on both sides of the center plate-like contact LI in the Y direction. That is, such rows of the plurality of plugs VY1 are substantially line-symmetric with respect to the center plate-like contact LI.

Note that the positional relation among the rows of the plurality of plugs VY1 arranged in a direction along the X direction, is maintained also in such positionally corrected plugs VY1.

That is, the distance in the Y direction between the center positions in the Y direction of the plurality of plugs VY1 in the first and second rows in the Y direction from the plate-like contact LI, is substantially equal to the distance in the Y direction between the center positions in the Y direction of the plurality of plugs VY1 in the third and fourth rows in the Y direction from the plate-like contact LI.

On the other hand, the distance in the Y direction between the center positions in the Y direction of the plurality of plugs VY1 in the second and third rows in the Y direction from the plate-like contact LI, is longer than the distance between the center positions in the Y direction of the plugs VY1 in other rows neighboring in the Y direction, such as the first and second rows, or the third and fourth rows.

FIGS. 6A to 6C have explained the exemplary structure of the memory region MR1s that neighbors the staircase region SR, while placing the select gate contact region SGRs in between. The structure of the first modified example is, however, also applicable to the memory region MR that neighbors the staircase region SR, while placing the select gate contact region SGRt and the through-contact region TP in between. Since the stress in such memory region MR is smaller than that in the memory region MR1s illustrated in FIGS. 6A to 6C, so that the amount of correction of the plugs CH1 and VY1, smaller than that in FIGS. 6A to 6C, will suffice.

According to the semiconductor memory device of the first modified example, the center positions in the Y direction of the plurality of plugs VY1 vary in accordance with the center positions of the plugs CH1 to be connected. By thus arranging the plugs VY not susceptible to the difference of stresses between the insulating film 50 filled in the staircase region SR, and the surrounding stacked body LM, in accordance with the plugs CH1 having been positionally corrected relative to the pillars PL, also the connection between the plugs CH1 and VY1 may be made more reliable.

According to the semiconductor memory device of the first modified example, any other effects same as those of the semiconductor memory device 1 of the first embodiment can be obtained.

Second Modified Example

In the aforementioned first modified example, the positions of placement of both the plugs CH1 and VY1 have been corrected by 100% relative to the deviated pillars PL, to make the connection between the pillars PL and the plugs CH1 and VY1 more reliable.

A structure of the plugs CH that can more reliably mediate the pillars PL and the plugs VY is, however, obtainable also by adjusting the positional correction of the plugs CH relative to the pillars PL, to a value smaller than 100%.

Next, a semiconductor memory device according to a second modified example of the first embodiment will be explained, referring to FIGS. 7A to 7C. The semiconductor memory device of the second modified example is different from the first embodiment, in that some of the plugs CH are positionally corrected by 50% relative to the pillars PL to be connected.

Figure 7A:
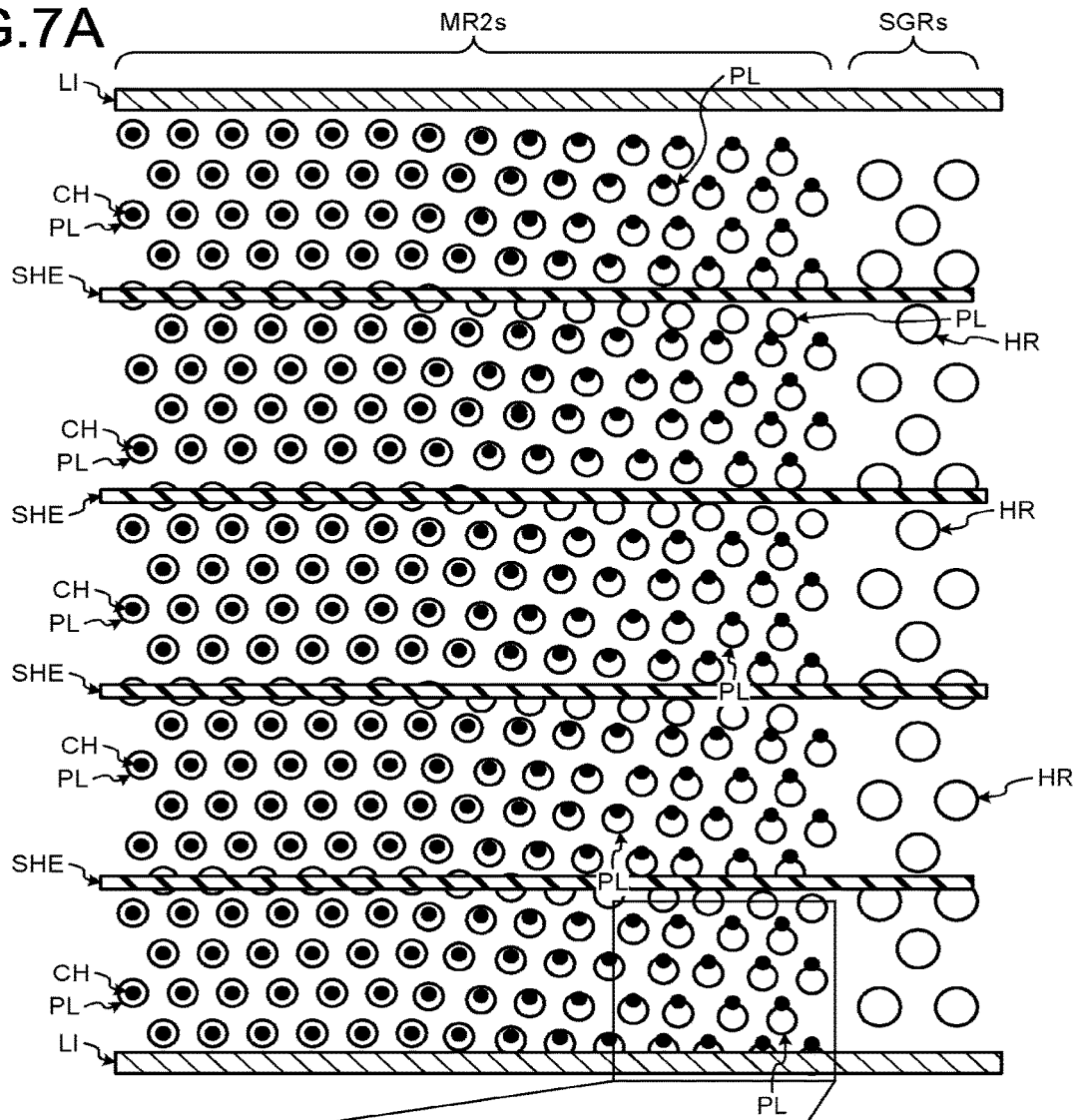
FIGS. 7A to 7C are schematic drawings illustrating an exemplary structure of a memory region of a semiconductor memory device according to a second modified example of the first embodiment.
Figure 7B:
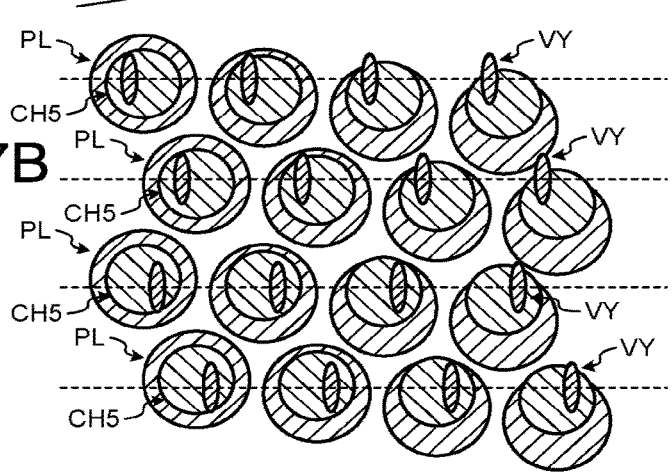
Figure 7C:
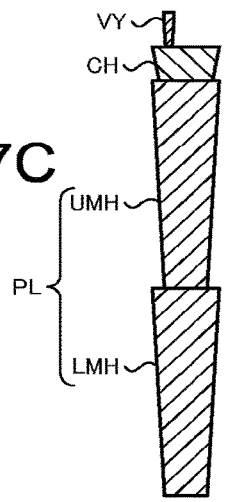

FIGS. 7A to 7C are schematic drawing illustrating an exemplary structure of a memory region MR2s of the semiconductor memory device according to the second modified example of the first embodiment.

More specifically, FIG. 7A is a top view that contains a part of the memory region MR2s, and a part of the select gate contact region SGRs. FIG. 7B is an enlarged top view illustrating a part, closer to the select gate contact region SGRs, of the memory region MR2s illustrated in FIG. 7A. FIG. 7C is the cross-sectional view illustrating the detailed structure of the pillar PL.

Also FIGS. 7A and 7B illustrate a region corresponded to one finger FGR in which the memory region MR2s and the select gate contact regions SGRs neighbor in the X direction the staircase region SR, without placing the through-contact region TP in between. Of the two plate-like contacts LI illustrated in FIG. 7A, the plate-like contact LI on the lower side of the drawing corresponds to the center plate-like contact LI that overlaps the staircase region SR.

Note that FIG. 7A does not illustrate an upper structure that contains the plugs VY in the memory region MR2s, and the contacts CC in the select gate contact region SGRs. FIG. 7B only illustrates the pillars PL, and the plugs CH5 and VY in the memory region MR2s. FIG. 7B is a drawing that corresponds to the drawing having been illustrated in the upper right of FIG. 4.

As illustrated in FIG. 7C, also in the semiconductor memory device of the second modified example, the plug CH is connected to the pillar PL, and the plug VY with the center position slightly deviated in the X direction is connected to the plug CH, like in the aforementioned first embodiment.

As illustrated in FIG. 7A, also in the semiconductor memory device of the second modified example, the center positions of placement in the Y direction of the pillars PL arranged in a direction along the X direction approach the center plate-like contact LI more largely as the position comes closer to the staircase region SR, like in the aforementioned first embodiment.

On the other hand, in the semiconductor memory device of the second modified example, the plurality of plugs CH contains the plugs CH5 whose positions in the Y direction relative to the pillars PL are corrected by 50%, unlike the aforementioned first embodiment. FIG. 7B illustrates the plugs CH5 whose positions of placement in the Y direction are corrected by 50% in accordance with the pillars PL.

As illustrated in FIG. 7B, typically on the pillars PL having deviated towards the plate-like contact LI, the center positions in the Y direction of the individual plugs CH5 are not exactly aligned with the center positions in the Y direction of the pillars PL to be connected, but only typically by 50%. Hence, the center positions in the Y direction of the plurality of plugs CH5 deviate from the center positions in the Y direction of the pillars PL to be connected, more largely in a direction departing in the Y direction from the plate-like contact LI, as the position comes closer to the staircase region SR.

Note that even in this case, the rows of the plurality of plugs CH5 aligned in a direction along the X direction more largely approach towards the center plate-like contact LI, as the position comes closer to the staircase region SR. Also such rows of the plurality of plugs CH5 follow a mutually inverted arrangement on both sides in the Y direction with respect to the center plate-like contact LI.

In the semiconductor memory device of the second modified example, the positions of placement of the plurality of plugs VY, in the X direction and in the Y direction, are similar to those in the aforementioned first embodiment.

FIGS. 7A to 7C have explained the exemplary structure of the memory region MR2s that neighbors the staircase region SR, while placing the select gate contact region SGRs in between. The structure of the second modified example is, however, also applicable to the memory region MR that neighbors the staircase region SR, while placing the select gate contact region SGRt and the through-contact region TP in between. Since the stress in such memory region MR is smaller than that in the memory region MR2s illustrated in FIGS. 7A to 7C, so that the amount of correction of the plugs CH5, smaller than that in FIGS. 7A to 7C, will suffice.

According to the semiconductor memory device of the second modified example, the center positions in the Y direction of the plurality of plugs CH5 deviate from the center positions in the Y direction of the pillars PL to be connected, more largely in a direction departing in the Y direction from the plate-like contact LI, as the position comes closer to the staircase region SR.

Such incomplete alignment of the positions of placement of the plurality of plugs CH5 with the pillars PL makes it possible to more reliably connect the plugs CH5 both to the pillars PL and the plugs VY.

According to the semiconductor memory device of the second modified example, any other effects same as those of the semiconductor memory device 1 of the first embodiment can be obtained.

Third Modified Example

Next, a semiconductor memory device according to a third modified example of the first embodiment will be explained, referring to FIGS. 8A to 8C. The semiconductor memory device of the third modified example is different from the first embodiment, in that the amount of positional correction relative to the pillars PL varies depending on the position of the plurality of rows of the plugs CH arranged in a direction along the X direction.

Figure 8A:
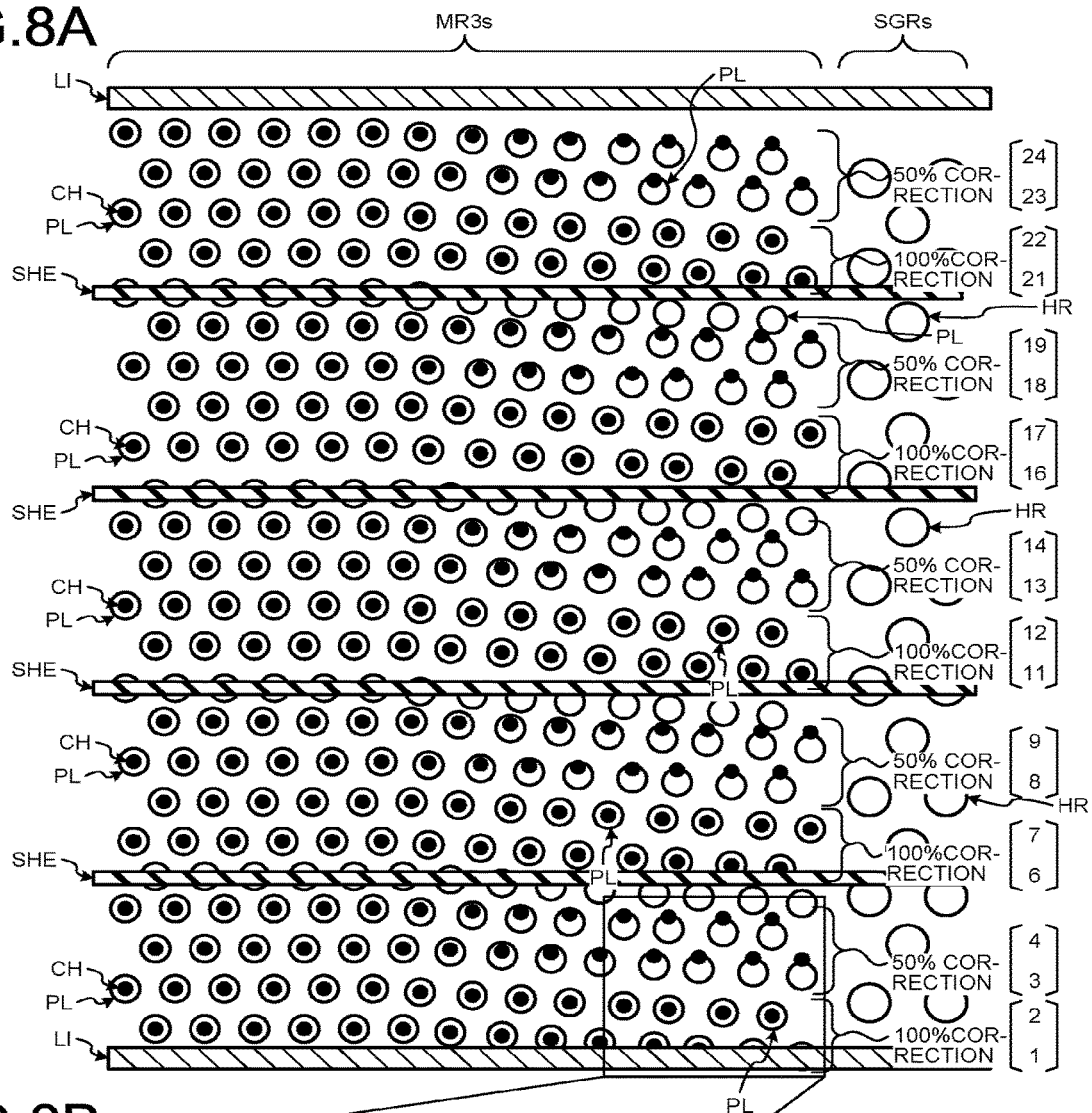
FIGS. 8A to 8C are schematic drawings illustrating an exemplary structure of a memory region of a semiconductor memory device according to a third modified example of the first embodiment.
Figure 8B:
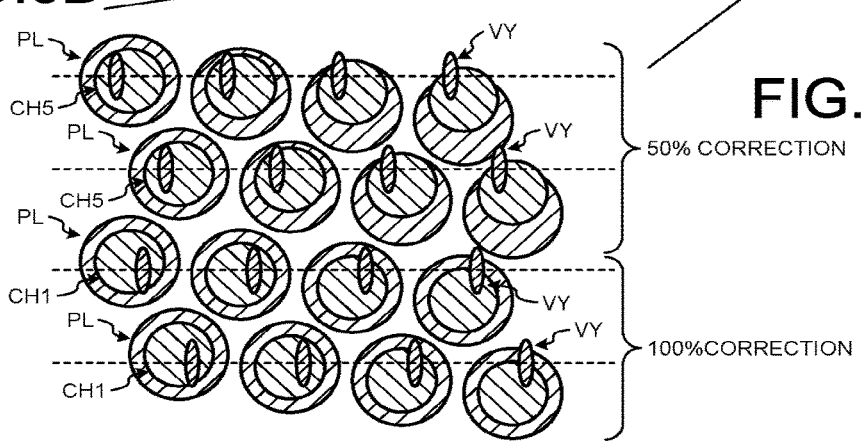
Figure 8C:
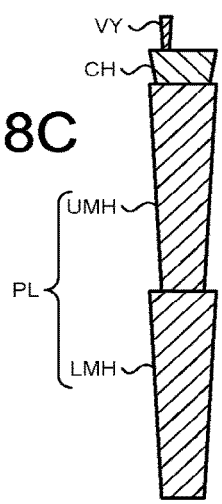

FIGS. 8A to 8C are schematic drawing illustrating an exemplary structure of a memory region MR3s of the semiconductor memory device according to the third modified example of the first embodiment;

More specifically, FIG. 8A is a top view that contains a part of the memory region MR3s, and a part of the select gate contact region SGRs. FIG. 8B is an enlarged top view illustrating a part, closer to the select gate contact region SGRs, of the memory region MR3s illustrated in FIG. 8A. FIG. 8C is the cross-sectional view illustrating the detailed structure of the pillar PL.

Also FIGS. 8A and 8B illustrate a region corresponded to one finger FGR in which the memory region MR3s and the select gate contact region SGRs neighbor in the X direction the staircase region SR, without placing the through-contact region TP in between. Of the two plate-like contacts LI illustrated in FIG. 8A, the plate-like contact LI on the lower side of the drawing corresponds to the center plate-like contact LI that overlaps the staircase region SR.

Note that FIG. 8A does not illustrate an upper structure that contains the plugs VY in the memory region MR3s, and the contacts CC in the select gate contact region SGRs. FIG. 8B only illustrates the pillars PL, and the plugs CH1, CH5, and VY in the memory region MR3s. FIG. 8B is a drawing that corresponds to the drawing having been illustrated in the upper right of FIG. 4.

As illustrated in FIG. 8C, also in the semiconductor memory device of the third modified example, the plug CH is connected to the pillar PL, and the plug VY with the center position slightly deviated in the X direction is connected to the plug CH, like in the aforementioned first embodiment.

As illustrated in FIG. 8A, also in the semiconductor memory device of the third modified example, the center positions of placement in the Y direction of the pillars PL arranged in a direction along the X direction more largely approach the center plate-like contact LI that divides the staircase region SR in the Y direction, as the position comes closer to the staircase region SR, like in the aforementioned first embodiment.

On the other hand, in the semiconductor memory device of the third modified example, the positions of placement of the plugs CH are corrected by 50% relative to the pillars PL to be connected in some rows, out of the plurality of the rows of the plugs CH arranged in a direction along the X direction, and are corrected by 100% in other some rows.

More specifically, the positions of placement of the plugs CH1 in the first and second rows from the center plate-like contact LI are corrected by 100% relative to the pillars PL. Meanwhile, the positions of placement of the plugs CH5 in the third and fourth rows from the center plate-like contact LI are corrected by 50% relative to the pillars PL. Such positions of placement of the plugs CH1 and CH5 are periodically repeated thereafter.

That is, while skipping the dummy pillars in the fifth row from the plate-like contact LI, the positions of placement of the plugs CH in the sixth and seventh rows are corrected by 100% relative to the pillars PL, meanwhile the positions of placement of the plugs CH in the eighth and ninth rows are corrected by 50% relative to the pillars PL.

Moreover, while skipping the dummy pillars in the tenth row from the plate-like contact LI, the positions of placement of the plugs CH in the eleventh and twelfth rows are corrected by 100% relative to the pillars PL, meanwhile the positions of placement of the plugs CH in the thirteenth and fourteenth rows are corrected by 50% relative to the pillars PL.

Such periodic arrangement of the plugs CH1 and CH5 is similarly repeated also on the opposite side in the Y direction across the center plate-like contact LI. That is, the periodic arrangement of the plugs CH1 and CH5 is repeated in an inverted manner on the opposite side in the Y direction with respect to the center plate-like contact LI.

As illustrated in FIG. 8B, according to such arrangement of the plugs CH1 and CH5, the amount of deviation of the plugs CH1 and CH5 relative to the individual pillars PL to be connected differs typically between the second and third rows, between the seventh and eighth rows, and twelfth and thirteenth rows, at which the correction value of the plugs CH1 and CH5 relative to the pillars PL switches. In the semiconductor memory device of the third modified example, the positions of placement of the plurality of plugs VY, in the X direction and in the Y direction, are similar to those in the aforementioned first embodiment. Hence, also the direction of the deviation at the center positions in the Y direction of the plugs VY will switch, typically between the second and third rows, between the seventh and eighth rows, and between the twelfth and thirteenth rows.

That is, the amount of deviation of the center positions in the Y direction between the plugs CH5 and the pillars PL typically in the third, fourth, eighth, ninth, thirteenth, and fourteenth rows, all having a correction value of 50% relative to the pillars PL, is larger, in the direction departing from the plate-like contact LI relative to the pillars PL, than the amount of deviation of the center positions in the Y direction between the plugs CH1 and the pillars PL typically in the first, second, sixth, seventh, eleventh, and twelfth rows having a correction value relative to the pillars PL larger than that for the plugs CH5.

Meanwhile, typically in the first, second, sixth, seventh, eleventh, and twelfth rows, all having a correction value of 100% relative to the pillars PL, the center positions in the Y direction of the plugs CH1 deviate stepwise from the center positions in the Y direction of the respective plugs VY to be connected, in a direction approaching the plate-like contact LI, by a substantially constant amount of deviation in the X direction.

Meanwhile, also typically in the third, fourth, eighth, ninth, thirteenth, and fourteenth rows, all having a correction value of 50% relative to the pillars PL, the center positions in the Y direction of the plugs CH5 deviate stepwise from the center positions in the Y direction of the respective plugs VY to be connected, in a direction approaching the plate-like contact LI, by a substantially constant amount of deviation in the X direction.

Note that the amount of stepwise deviation of the center positions of the plugs CH5 from the center positions of the plugs VY, is smaller than the amount of stepwise deviation of the center positions of the plugs CH1 from the center positions of the plugs VY.

On the other hand, the center positions in the Y direction of the plugs VY typically in the third, fourth, eighth, ninth, thirteenth, and fourteenth rows, and the center positions in the Y direction of the plugs VY typically in the first, second, sixth, seventh, eleventh, and twelfth rows, deviate from each other oppositely in the Y direction, relative to the design-based center positions in the Y direction of the pillars PL and the plugs CH.

Hence, which is larger or smaller, the amount of deviation of the center positions in the Y direction between the plugs CH5 and the plugs VY typically in the third, fourth, eighth, ninth, thirteenth, and fourteenth rows, or, the amount of deviation of the center positions in the Y direction between the plugs CH1 and the plugs VY typically in the first, second, sixth, seventh, eleventh, and twelfth rows, depends on the situation.

FIGS. 8A to 8C have explained the exemplary structure of the memory region MR3s that neighbors the staircase region SR, while placing the select gate contact region SGRs in between. The structure of the third modified example is, however, also applicable to the memory region MR that neighbors the staircase region SR, while placing the select gate contact region SGRt and the through-contact region TP in between. Since the stress in such memory region MR is smaller than that in the memory region MR3s illustrated in FIGS. 8A to 8C, so that the amount of correction of the plugs CH1 and CH5, smaller than that in FIGS. 8A to 8C, will suffice.

According to the semiconductor memory device of the third modified example, the positions of placement of the plugs CH1 relative to the pillars PL are corrected by 100% typically in the first, second, sixth, seventh, eleventh, and twelfth rows, meanwhile the positions of placement of the plugs CH5 relative to the pillars PL are corrected by 50% typically in the third, fourth, eighth, ninth, thirteenth, and fourteenth rows.

As described previously, comparing typically the first, second, sixth, seventh, eleventh, and twelfth rows, with typically the third, fourth, eighth, ninth, thirteenth, and fourteenth rows, the center positions in the Y direction of the plugs VY deviate from the design-based center positions in the Y direction of the pillars PL and the plugs CH, oppositely in the Y direction.

Typically in the first, second, sixth, seventh, eleventh, and twelfth rows in which the center positions in the Y direction of the plugs VY deviate from the design-based center positions in the Y direction of the pillars PL and the plugs CH towards the plate-like contact LI, the positional deviation in the Y direction of the pillars PL agrees with the direction of deviation in the Y direction of the plugs VY. Hence, the pillars PL having deviated towards the plate-like contact LI cause relatively small deviation from the plugs VY.

As described previously, by correcting by 100% the positions of placement of the plugs CH1 relative to the pillars PL typically in the first, second, sixth, seventh, eleventh, and twelfth rows in which the positional deviation from the plugs VY tends to be small, it now becomes possible to more reliably connect the plugs CH1 to the pillars PL, while maintaining the connection with the plugs VY.

Moreover, typically in the third, fourth, eighth, ninth, thirteenth, and fourteenth rows in which the center positions in the Y direction of the plugs VY deviate from the design-based center positions in the Y direction of the pillars PL and the plugs CH, in the direction departing from the plate-like contact LI, the positional deviation in the Y direction of the pillars PL occurs in the direction opposite to the deviation in the Y direction of the plugs VY. Hence, the pillars PL having deviated towards the plate-like contact LI cause relatively large deviation from the plugs VY.

As described previously, with the positions of placement of the plugs CH5 corrected by 50% relative to the pillars PL typically in the third, fourth, eighth, ninth, thirteenth, and fourteenth rows, in which the positional deviation from the plugs VY tends to be large, it now becomes possible to more reliably connect the plugs CH5 to the pillars PL, while maintaining the connection with the plugs VY.

According to the semiconductor memory device of the third modified example, any other effects same as those of the semiconductor memory device 1 of the first embodiment can be obtained.

Fourth Modified Example

Next, a semiconductor memory device according to a fourth modified example of the first embodiment will be explained, referring to FIGS. 9A to 9C. The semiconductor memory device of the fourth modified example is different from the aforementioned first embodiment, in that the amount of positional correction relative to the pillars PL varies depending on the position of rows each containing the plurality of plugs CH arranged in a direction along the X direction.

FIGS. 9A to 9C are schematic drawing illustrating an exemplary structure of a memory region MR4s of the semiconductor memory device according to the fourth modified example of the first embodiment.

More specifically, FIG. 9A is a top view that contains a part of the memory region MR4s, and a part of the select gate contact region SGRs. FIG. 9B is an enlarged top view illustrating a part, closer to the select gate contact region SGRs, of the memory region MR4s illustrated in FIG. 9A. FIG. 9C is the cross-sectional view illustrating the detailed structure of the pillar PL.

Also FIGS. 9A and 9B illustrate a region corresponded to one finger FGR in which the memory region MR4s and the select gate contact region SGRs neighbor in the X direction the staircase region SR, without placing the through-contact region TP in between. Of the two plate-like contacts LI illustrated in FIG. 9A, the plate-like contact LI on the lower side of the drawing corresponds to the center plate-like contact LI that overlaps the staircase region SR.

Note that FIG. 9A does not illustrate an upper structure that contains the plugs VY in the memory region MR4s, and the contacts CC in the select gate contact region SGRs. FIG. 9B only illustrates the pillars PL, and the plugs CH1, CH7, CH5, CH2, and VY in the memory region MR4s. FIG. 9B is a diagram that corresponds to the drawing having been illustrated in the upper right of FIG. 4.

As illustrated in FIG. 9C, also in the semiconductor memory device of the fourth modified example, the plug CH is connected to the pillar PL, and the plug VY with the center position slightly deviated in the X direction is connected to the plug CH, like in the aforementioned first embodiment.

As illustrated in FIG. 9A, also in the semiconductor memory device of the fourth modified example, the center positions of placement in the Y direction of the pillars PL arranged in a direction along the X direction approach the center plate-like contact LI more largely as the position comes closer to the staircase region SR, like in the aforementioned first embodiment.

On the other hand, in the semiconductor memory device of the fourth modified example, the positions of placement of the plugs CH relative to the pillars PL to be connected are corrected for every row that contains the plurality of plugs CH arranged in a direction along the X direction, by a correction value of 100%, 75%, 50% or 25%.

More specifically, the positions of placement of the plugs CH1 in the first row from the center plate-like contact LI are corrected by 100% relative to the pillars PL. The positions of placement of the plugs CH7 in the second row from the center plate-like contact LI are corrected by 75% relative to the pillars PL. The positions of placement of the plugs CH5 in the third row from the center plate-like contact LI are corrected by 50% relative to the pillars PL. The positions of placement of the plugs CH2 in the fourth row from the center plate-like contact LI are corrected by 25% relative to the pillars PL. Such positions of placement of the plugs CH1, CH7, CH5, and CH2 are periodically repeated thereafter.

That is, while skipping the dummy pillars in the fifth column from the plate-like contact LI, the positions of placement of the plugs CH (CH1, CH7, CH5, CH2) in the sixth to ninth rows are corrected by 100%, 75%, 50%, and 25%, respectively, relative to the pillars PL.

Meanwhile, while skipping the dummy pillars in the tenth row from the plate-like contact LI, the positions of placement of the plugs CH (CH1, CH7, CH5, CH2) in the eleventh to fourteenth rows are corrected by 100%, 75%, 50%, and 25%, respectively, relative to the pillars PL.

Such periodic arrangement of the plugs CH1, CH7, CH5, and CH2 is similarly repeated also on the opposite side in the Y direction across the center plate-like contact LI. That is, the periodic arrangement of the plugs CH1, CH7, CH5, and CH2 is repeated in an inverted manner on the opposite side in the Y direction with respect to the plate-like contact LI.

As illustrated in FIG. 9B, according to such arrangement of the plugs CH1, CH7, CH5, and CH2, the amounts of deviation of the plugs CH1, CH7, CH5, and CH2 relative to the individual pillars PL to be connected will differ. In the semiconductor memory device of the fourth modified example, the positions of placement of the plurality of plugs VY in the X direction and the Y direction are similar to those in the aforementioned first embodiment, diversifying the amount of deviation of the plugs CH1, CH7, CH5, and CH2 from the respective plugs VY to be connected.

That is, the amount of deviation of the center positions in the Y direction between the plugs CH7 and the pillars PL typically in the second, seventh, and twelfth rows, all having a correction value of 75% relative to the pillars PL, is larger, in the direction departing from the plate-like contact LI relative to the pillars PL, than the amount of deviation of the center positions in the Y direction between the plugs CH1 and the pillars PL typically in the first, sixth, and eleventh rows having a correction value relative to the pillars PL larger than that for the plugs CH7.

Meanwhile, the amount of deviation of the center positions in the Y direction between the plugs CH5 and the pillars PL typically in the third, eighth, and thirteenth rows, all having a correction value of 50% relative to the pillars PL, is larger, in the direction departing from the plate-like contact LI relative to the pillars PL, than the amount of deviation of the center positions in the Y direction between the plugs CH7 and the pillars PL typically in the second, seventh, and twelfth rows having a correction value relative to the pillars PL larger than that for the plugs CH5.

Moreover, the amount of deviation of the center positions in the Y direction between the plugs CH2 and the pillars PL typically in the fourth, ninth, and fourteenth rows, all having a correction value of 25% relative to the pillars PL, is larger, in the direction departing from the plate-like contact LI relative to the pillars PL, than the amount of deviation of the center positions in the Y direction between the plugs CH5 and the pillars PL typically in the third, eighth, and thirteenth rows having a correction value relative to the pillars PL larger than that for the plugs CH2.

Meanwhile, typically in the first, sixth, and eleventh rows, all having a correction value of 100% relative to the pillars PL, the center position in the Y direction of the plugs CH1 deviate stepwise from the center positions in the Y direction of the respective plugs VY to be connected, in a direction approaching the plate-like contact LI, by a substantially constant amount of deviation in the X direction.

Similarly, typically in the second, seventh, and twelfth rows, all having a correction value of 75% relative to the pillars PL, the center position in the Y direction of the plugs CH7 deviate stepwise from the center positions in the Y direction of the respective plugs VY to be connected, in a direction approaching the plate-like contact LI, by a substantially constant amount of deviation in the X direction.

Similarly, typically in the third, eighth, and thirteenth rows, all having a correction value of 50% relative to the pillars PL, the center position in the Y direction of the plugs CH5 deviate stepwise from the center positions in the Y direction of the respective plugs VY to be connected, in a direction approaching the plate-like contact LI, by a substantially constant amount of deviation in the X direction.

Similarly, typically in the fourth, ninth, and fourteenth rows, all having a correction value of 25% relative to the pillars PL, the center position in the Y direction of the plugs CH2 deviate stepwise from the center positions in the Y direction of the respective plugs VY to be connected, in a direction approaching the plate-like contact LI, by a substantially constant amount of deviation in the X direction.

On the other hand, the amount of deviation of the center positions in the Y direction between the plugs CH7 and the plugs VY typically in the second, seventh, and twelfth rows, become smaller than the amount of deviation of the center positions in the Y direction between the plugs CH1 and the plugs VY typically in the first, sixth, and eleventh rows having a correction value relative to the pillars PL larger than that for the plugs CH7.

Meanwhile, the amount of deviation of the center positions in the Y direction between the plugs CH2 and the plugs VY typically in the fourth, ninth, and fourteenth rows, become smaller than the amount of deviation of the center positions in the Y direction between the plugs CH5 and the plugs VY typically in the third, eighth, and thirteenth rows having a correction value relative to the pillars PL larger than that for the plugs CH2.

On the other hand, the center positions in the Y direction of the plugs VY typically in the third, eighth, and thirteenth rows, and the center positions in the Y direction of the plugs VY typically in the second, seventh, and twelfth rows, deviate from each other oppositely in the Y direction, relative to the design-based center positions in the Y direction of the pillars PL and the plugs CH.

Hence, which is larger or smaller, the amount of deviation of the center positions in the Y direction between the plugs CH5 and the plugs VY typically in the third, eighth, and thirteenth rows, or, the amount of deviation of the center positions in the Y direction between the plugs CH7 and the plugs VY typically in the second, seventh, and twelfth rows, depends on the situation.

FIGS. 9A to 9C have explained the exemplary structure of the memory region MR4s that neighbors the staircase region SR, while placing the select gate contact region SGRs in between. The structure of the fourth modified example is, however, also applicable to the memory region MR that neighbors the staircase region SR, while placing the select gate contact region SGRt and the through-contact region TP in between. Since the stress in such memory region MR is smaller than that in the memory region MR4s illustrated in FIGS. 9A to 9C, so that the amount of correction of the plugs CH1, CH2, CH5, and CH7, smaller than that in FIGS. 9A to 9C, will suffice.

According to the semiconductor memory device of the fourth modified example, the amount of correction for the pillars PL is made different for each row of the plugs CH1, CH7, CH5, and CH2 arranged in the direction along the X direction.

By thus positionally correcting the plugs CH1 and CH7 relative to the pillars PL, by relatively large correction values such as 100% and 75%, typically in the first, second, sixth, seventh, eleventh, and twelfth rows having the plugs VY whose center positions in the Y direction deviate from the design-based center positions in the Y direction of the pillars PL and the plugs CH towards the plate-like contact LI, it now becomes possible to more reliably connect the plugs CH1 and CH7, both to the pillars PL and the plugs VY.

By thus positionally correcting the plugs CH5 and CH2 relative to the pillars PL, by relatively small correction values such as 50% and 25%, typically in the third, fourth, eighth, ninth, thirteenth, and fourteenth rows having the plugs VY whose center positions in the Y direction deviate from the design-based center positions in the Y direction of the pillars PL and the plugs CH, in the direction departing from the plate-like contact LI, it now becomes possible to more reliably connect the plugs CH5 and CH2, both to the pillars PL and the plugs VY.

Moreover, such fine variation of the amount of correction for each row of the plugs CH1, CH7, CH5, and CH2 will make the regularity of the rows of the plugs CH1, CH7, CH5, and CH2 more reliable. This can improve the dimensional accuracy of formation of the holes in which these plugs CH1, CH7, CH5, and CH2 are to be provided.

According to the semiconductor memory device of the fourth modified example, any other effects same as those of the semiconductor memory device 1 of the first embodiment can be obtained.

Fifth Modified Example

Next, a semiconductor memory device 2 according to a fifth modified example of the first embodiment will be explained, referring to FIG. 10. The semiconductor memory device 2 of the fifth modified example is different from the aforementioned first embodiment, in that the positions of the isolation layers SHEc are more largely corrected in accordance with the pillars PL that deviate towards the plate-like contact LI, as the position comes closer to the staircase region SR.

Figure 10:
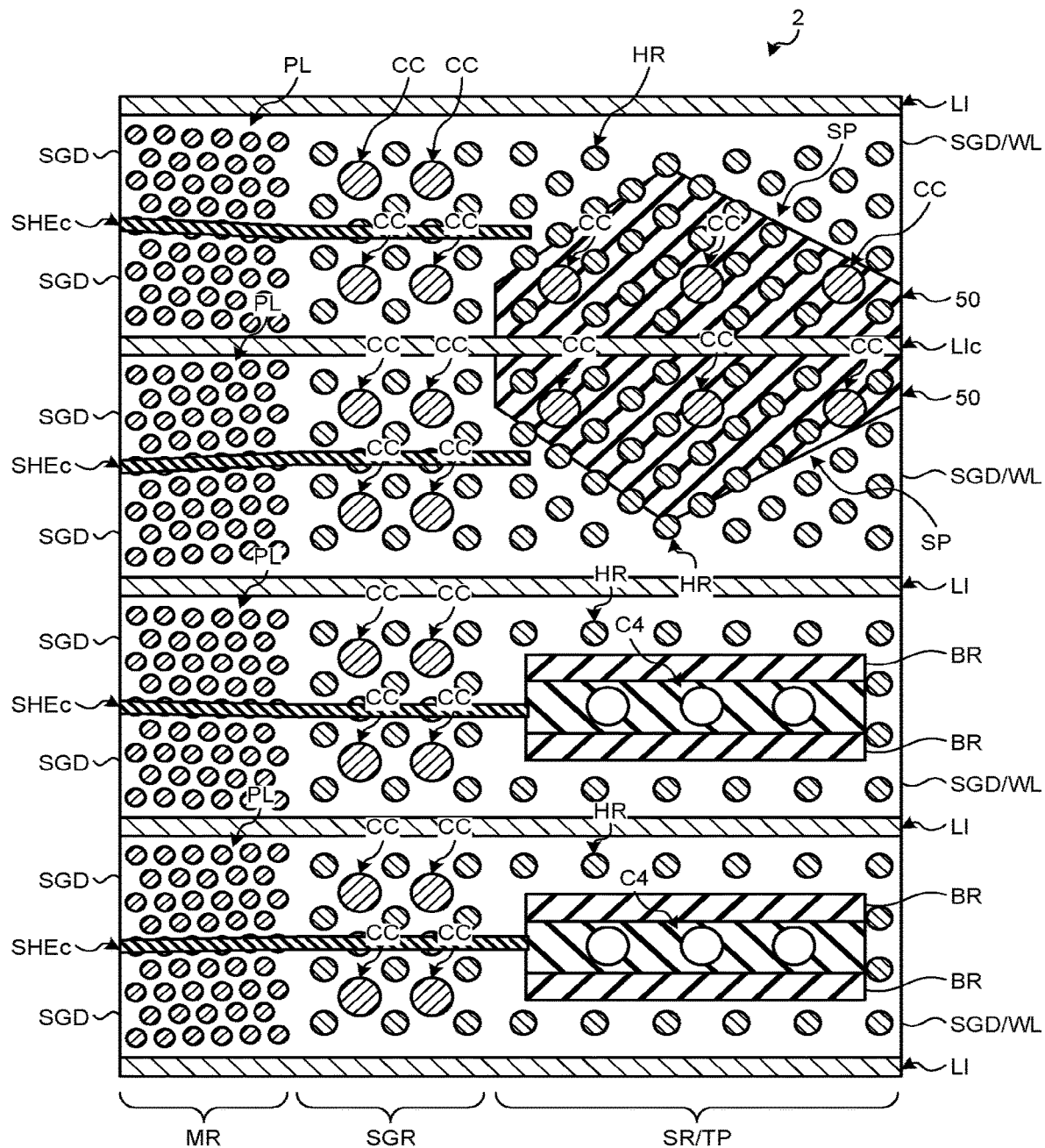
FIG. 10 is a schematic drawing illustrating an exemplary structure of a memory region of a semiconductor memory device according to a fifth modified example of the first embodiment.

FIG. 10 is a schematic drawing illustrating an exemplary structure of a memory region MR of the semiconductor memory device 2 according to the fifth modified example of the first embodiment.

More specifically, FIG. 10 is a top view that contains a part of the memory region MR, the select gate contact region SGR, as well as a part of the staircase region SR and a part of the through-contact region TP. That is, FIG. 10 illustrates partial regions of two fingers FGR having the staircase region SR, and two fingers FGR having the through-contact regions TP, totaling four fingers FGR.

Note that FIG. 10 does not illustrate an upper structure that contains the plugs connected typically to the pillars PL, the plate-like contacts LI, and the contacts CC. Note, however, that the semiconductor memory device 2 of the fifth modified example has the plugs CH, CH1, CH2, CH5, and CH7 and the plugs VY and VY1 of any of the aforementioned first embodiment, and the first to fourth modified examples.

That is, also in the semiconductor memory device 2 of the fifth modified example, the positions of some of the plugs CH are corrected in accordance with the deviated pillars PL. Alternatively, some of the plugs VY in the semiconductor memory device 2 of the fifth modified example may be positionally corrected in accordance with the pillars PL and the plugs CH.

As illustrated in FIG. 10, also in the semiconductor memory device 2 of the fifth modified example, the positions of placement in the Y direction of the pillars PL arranged in a direction along the X direction approach the center plate-like contact LI more largely as the position comes closer to the staircase region SR, like in the aforementioned first embodiment.

Also in the select gate contact region SGR and the staircase region SR of the semiconductor memory device 2, the positions of placement in the Y direction of the columnar portions HR, arranged in a direction along the X direction, vary depending on the positions of placement in the X direction of these columnar portions HR, like in the aforementioned first embodiment.

On the other hand, in the memory region MR of the semiconductor memory device 2 of the fifth modified example, the isolation layer SHEc has a predetermined portion that extends along the center plate-like contact LI in accordance with the pillars PL having been affected by the stress during the replacement for forming the stacked body LM, with the distance in the Y direction from the center plate-like contact LI continuously varied depending on the position in the X direction of the isolation layer SHEc. That is, the portion of the isolation layer SHEc closer to the staircase region SR approaches the center plate-like contact LI more largely as the position comes closer to the staircase region SR.

More specifically, in the memory region MRs neighboring the staircase region SR without placing the through-contact region TP in between (see FIGS. 1A and 1B), the pillars PL are more largely affected by the stress, and more largely deviated. Hence, the positions of placement of the isolation layer SHEc are determined so that also the amount of deviation of the isolation layer SHEc increases in accordance with the pillars PL.

In contrast, in the memory region MRt neighboring the staircase region SR while placing the through-contact region TP in between (see FIGS. 1A and 1B), the influence of stress is relatively small, only to cause a relatively small deviation of the pillars PL. Hence, the positions of placement of the isolation layer SHEc are determined so that also the amount of deviation of the isolation layer SHEc decreases in accordance with the pillars PL.

In some cases where the pillars deviate while being affected by the stress typically in the semiconductor memory device having the stacked structure, the isolation layer, having been designed to overlap the pillars, would be formed while being deviated from the pillars.

In this case, at least at a position deviated from the pillar, the isolation layer would be formed so as to penetrate not only the conductive layer to be isolated in the stacked body, but also a conductive layer therebelow. This may isolate also the conductive layer which should function as the word line, and may adversely affect characteristics of the semiconductor memory device.

According to the semiconductor memory device 2 of the fifth modified example, the isolation layer SHEc has a predetermined portion that extends on one side in the Y direction of the center plate-like contact LI that divides the staircase region SR in the Y direction, and extends along the plate-like contact LI, with the distance in the Y direction from the center plate-like contact LI continuously varied depending on the position in the X direction. Meanwhile on the other side in the Y direction of the plate-like contact LI that divides the staircase region SR in the Y direction, the isolation layer SHEc has a portion that extends along the plate-like contact LI, with the predetermined position inverted in the Y direction from the isolation layer SHEc on one side of the plate-like contact LI, with respect to the plate-like contact LI.

By thus arranging the isolation layer SHEc, which is formed after the replacement for forming the stacked body LM, and unlikely to be affected by the stress during the replacement, in accordance with the pillars PL possibly affected by the stress, the isolation layer SHEc can be positioned on the pillars PL that are designed to be overlapped. Hence, the depth of the isolation layer SHEc in the stacked body LM may be made almost uniform, making it possible to obtain the semiconductor memory device 2 with desired characteristics.

Note that the isolation layer SHE may be positionally corrected in accordance not only with the pillars PL in the memory region MR, but also with the columnar portions HR in the select gate contact region SGR.

Furthermore, the structure of the fifth modified example, in which the isolation layers SHEc are positionally corrected in accordance with the pillars PL, is applicable to the semiconductor memory device, in an appropriate combination with any of the first embodiment, and the first to fourth modified examples.

Second Embodiment

Hereinafter, the second embodiment will be detailed referring to the attached drawings. A semiconductor memory device of the second embodiment is different from the first embodiment, in that the peripheral circuit is arranged above the stacked body. Note that all structures in the drawing below, same as those in the first embodiment, will have same reference signs to skip the explanation.
(Exemplary Structure of Semiconductor Memory Device)

Figure 11A:
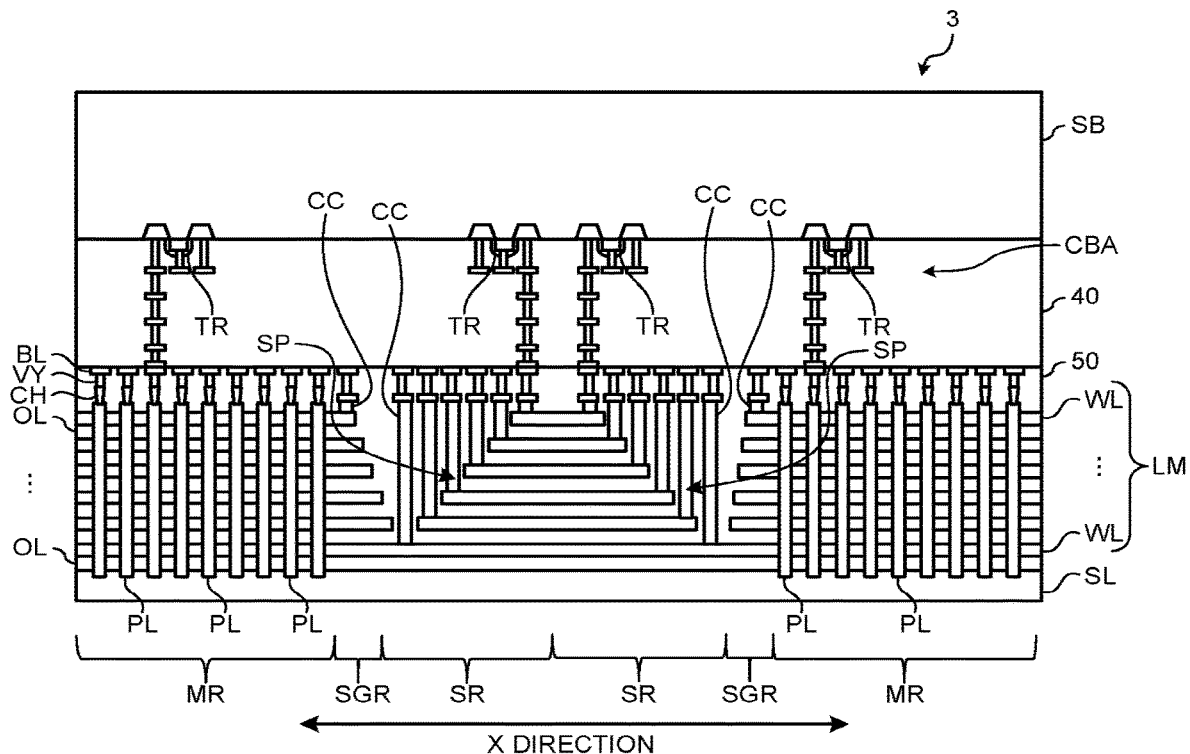
FIGS. 11A and 11B are drawings illustrating a schematic structure of a semiconductor memory device according to a second embodiment.
Figure 11B:
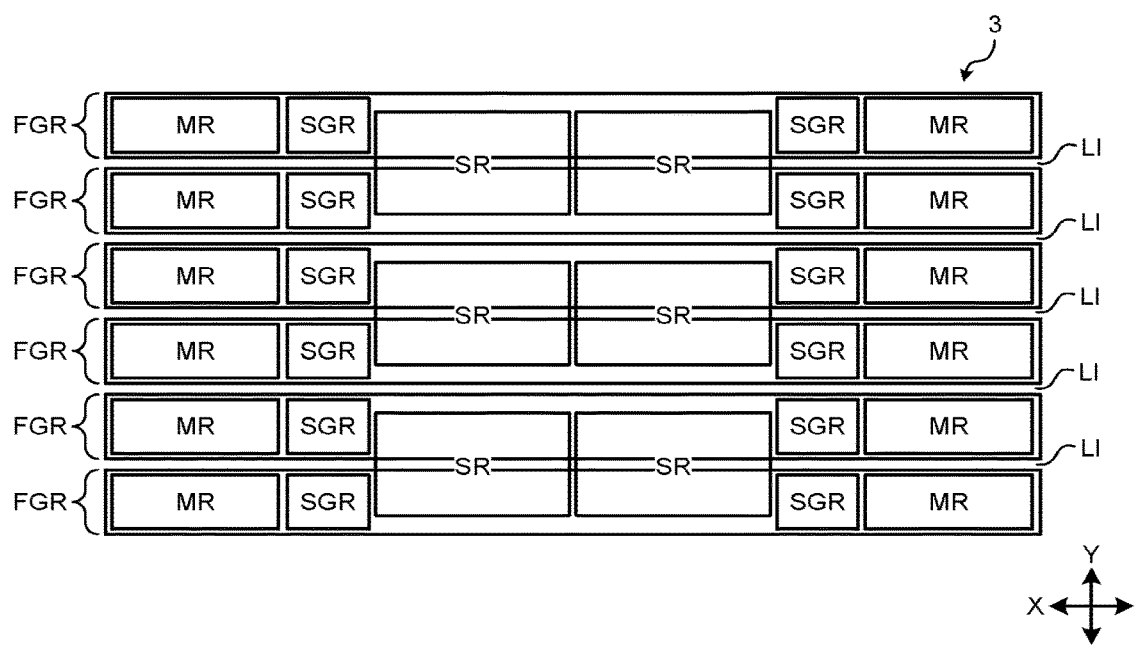

FIGS. 11A and 11B are drawings illustrating an exemplary schematic structure of a semiconductor memory device 3 according to the second embodiment. FIG. 11A is a cross-sectional view of the semiconductor memory device 3 taken in the X direction, and FIG. 11B is a schematic plan view illustrating a layout of the semiconductor memory device 3. Note that FIG. 11A is presented without hatching for better visibility. FIG. 11A is also presented without a part of upper wirings.

As illustrated in FIG. 11A, the semiconductor memory device 3 has a peripheral circuit CBA arranged above the stacked body LM. More specifically, the stacked body LM is arranged above the source line SL. The stacked body LM is covered with the insulating film 50. Above the insulating film 50, the peripheral circuit CBA covered with the insulating film 40 is arranged. The substrate SB on which the peripheral circuit CBA is provided is arranged further above the peripheral circuit CBA.

As illustrated in FIG. 11B, one finger FGR has arranged therein the memory region MR, the staircase region SR, the staircase region SR, and the memory region MR, in this order from one end towards the other end in the X direction. The staircase region SR is arranged at a position that overlaps one plate-like contact LI, and is divided in the Y direction, like in the first embodiment. The semiconductor memory device 3 thus follows a pattern in which two fingers FGR arranged in the Y direction form a minimum unit to be repeated periodically in the Y direction.

Also in the semiconductor memory device 3 of the second embodiment, the staircase region SR may be constituted similarly to the aforementioned first embodiment. That is, the valley-like shape of the staircase region SR of the semiconductor memory device 3 is configured to have a portion in which the depth becomes maximum at a predetermined position between one end and the other end in the X direction, and the width becomes maximum in the Y direction. In addition, the plurality of staircase portions arranged in the staircase region SR has a substantially line-symmetric structure, across the center plate-like contact LI that divides the staircase region SR in the Y direction.

Hence, also in the semiconductor memory device 3 of the second embodiment, typically the pillars PL arranged in the memory region MR are more largely stressed to incline towards the center plate-like contact LI, as the position becomes closer to the staircase region SR, similarly to the semiconductor memory device 1 of the aforementioned first embodiment. Hence, any structure of the first embodiment, or the first to fifth modified examples is applicable also to the semiconductor memory device 3 of the second embodiment.

The semiconductor memory device 3 illustrated in FIGS. 11A and 11B is obtainable by separately forming the stacked body LM portion and the peripheral circuit CBA portion.

That is, the source line SL is formed on a support substrate such as a silicon substrate, and the stacked body LM is formed above the source line SL. Then in the stacked body LM, typically formed are the staircase part in which the word lines WL and so forth are terraced, the pillars PL, the columnar portions HR, the plate-like contacts LI, and the contacts CC.

On the other hand, the peripheral circuit CBA that typically contains transistor TR and wiring is separately formed on the substrate SB, and the insulating film 40 is then formed to cover the structure. The face of the substrate SB having the peripheral circuit CBA formed thereon, and the face of the support substrate having the stacked body LM formed thereon are then bonded, and the support substrates is removed typically by chemical mechanical polishing (CMP).

The process yields the semiconductor memory device 3 in which the stacked body LM and the peripheral circuit CBA are bonded at portions of the insulating films 50 and 40. In the semiconductor memory device 3, the peripheral circuit CBA is arranged above the stacked body LM, and the structures such as the pillars PL and the contacts CC of the stacked body LM are electrically connected typically through the upper wirings to the peripheral circuit CBA. Hence, the semiconductor memory device 3 is not necessarily provided with the through-contact region TP and the through-contact C4 in the stacked body LM.

(Method for Manufacturing Semiconductor Memory Device)

Figure 12:
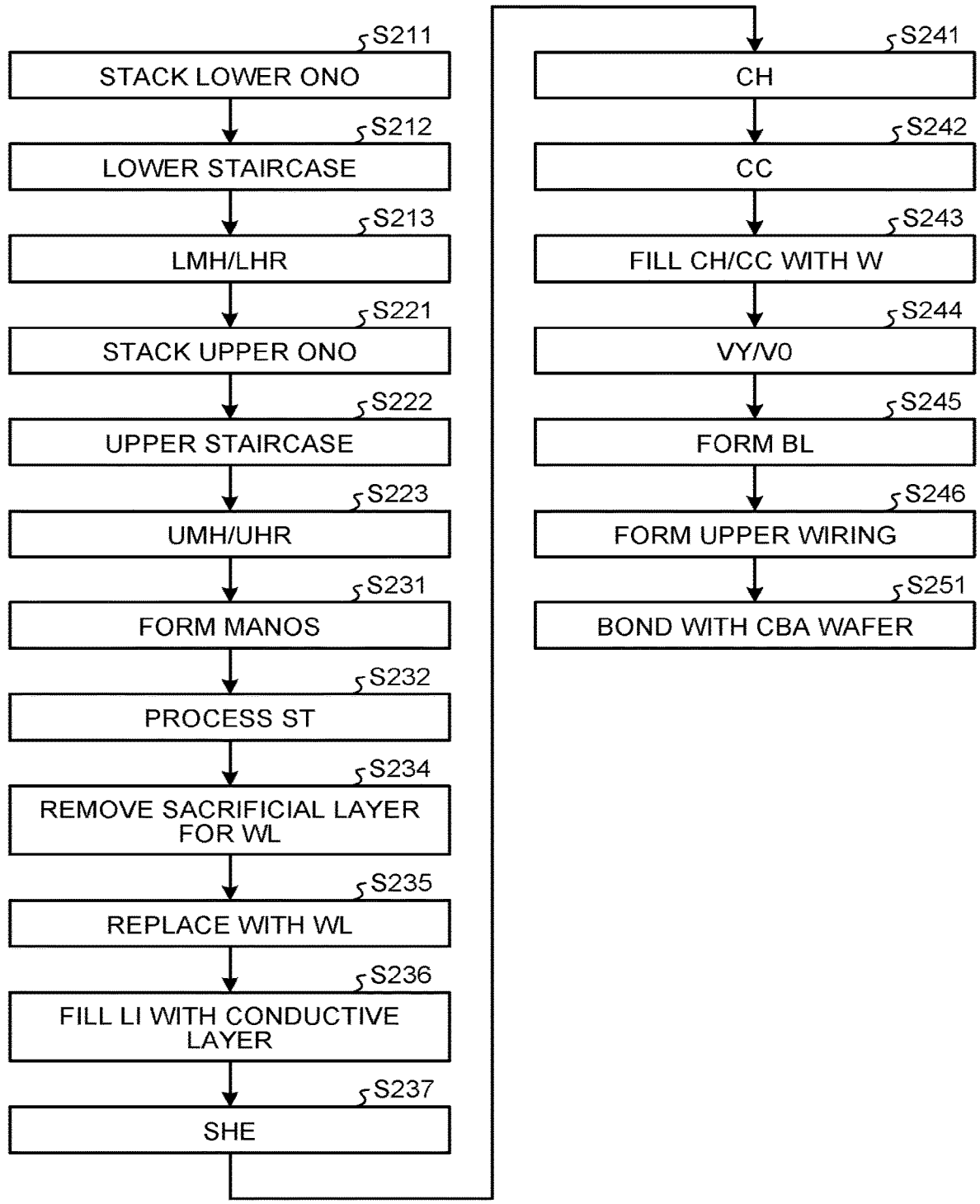
FIG. 12 is a flow chart exemplifying a part of procedures of a method for manufacturing the semiconductor memory device according to the second embodiment.

Next, a method for manufacturing the semiconductor memory device 3 of the second embodiment will be explained referring to FIG. 12. FIG. 12 is a flow chart exemplifying a part of procedures of the method for manufacturing the semiconductor memory device 3 according to the second embodiment.

As illustrated in FIG. 12, a plurality of sacrificial layers such as silicon nitride layers and a plurality of insulating layers OL are alternately stacked to form a lower ONO structure, above the support substrate having the source line SL formed thereon, thereby forming a first-tier stacked body (step S211).

Also a lower staircase portion is formed in the first-tier stacked body, and a recess thus produced by the staircase portion is filled with the insulating film 50 (step S212). Also the lower pillar LMH and the lower columnar portions LHR, filled with the sacrificial layer such as amorphous silicon layers, are formed in the first-tier stacked body (step S213).

Next, a plurality of sacrificial layers such as silicon nitride layers, and a plurality of insulating layers OL are alternately stacked on the first-tier stacked body to form an upper ONO structure, thereby forming a second-tier stacked body (step S221). Also an upper staircase portion is formed in the second-tier stacked body, and a recess thus produced by the staircase portion is filled with the insulating film 50 (step S222).

Also the memory holes and the holes, which later serve as the upper pillars UMH and the upper columnar portions UHR, are individually formed in the second-tier stacked body (step S223). Through these memory holes and the holes, the sacrificial layers having been filled in the lower pillar LMH and the lower columnar portion LHR are removed.

Next, the MANOS structure is formed in the lower pillars LMH and the upper pillars UMH, as well as in the lower columnar portions LHR and the upper columnar portions UHR of the select gate contact regions SGR, thereby forming the pillars PL and the columnar portions HR (step S231). On the other hand, in the staircase region SR, there are formed the columnar portions HR having the lower columnar portion LHR and the upper columnar portion UHR filled with the insulating layer.

Next, slits ST that penetrate the stacked body having the two-tire structure are formed (step S232).

Next, a removal liquid such as hot phosphoric acid is infused through the slits ST, to remove the sacrificial layer of the stacked body (step S234). A source gas such as tungsten is then introduced through the slits ST, to form the plurality of word lines WL and so forth, to a part where the sacrificial layer has been removed (step S235).

As a result of such replacement, obtainable is the stacked body LM having the two-tire structure, in which the plurality of word lines WL and the plurality of insulating layers OL are alternately stacked. During the replacement, the upper end portion of the slits ST that divide the staircase region SR in the Y direction may be compressed, so that a structure such as the pillars PL and the columnar portions HR that belong to the fingers FGR on both sides in the Y direction of the slits ST may incline towards the slits ST.

Next, a liner layer such as an insulating layer is formed in the slits ST, and a conductive layer is further filled, to form the plate-like contacts LI (step S236). Also the isolation layers SHE that extend in a direction along the X direction in the memory region MR, and reach the staircase region SR are formed (step S237). The isolation layers SHEc in this process may alternatively be formed, with the arrangement adjusted in accordance with the deviated pillars PL. One or a plurality of select gate lines SGD is thus formed in the upper portion of the stacked body LM.

Next, holes used later for the plugs CH are formed in an upper layer above the stacked body LM (step S241). The holes herein may be formed in accordance with the pillars PL having deviated. Also the plurality of contact holes that will serve later as the contacts CC is formed in the staircase region SR and the select gate contact region SGR (step S242).

Next, a liner layer such as an insulating layer is formed in these holes and contact holes, and a conductive layer is further filled. The plugs CH individually connected to the plurality of pillars PL, and the contacts CC individually connected to the plurality of word lines WL and the select gate lines SGD and SGS are thus formed (step S243). These plugs CH may typically include the plugs CH1, CH7, CH5, and CH2 to which the structure of any one of the first embodiment or the first to fourth modified example is applied.

Next, plugs VY and V0 that are connected to the plugs CH and the contacts CC, respectively, are formed in a layer further above the plugs CH (step S244). The plugs VY in this process may be formed typically in accordance with the plugs CH1, CH7, CH5, CH2 having been positionally corrected relative to the pillars PL. The thus formed plugs VY in this case may typically include the plugs VY1 of the first modified example.

Also the bit lines BL connected to the plugs VY are formed in a layer further above the plugs VY (step S245). Also the upper wirings connected to the plugs V0 are formed in a layer further above the plugs V0 (step S246).

Next, the substrate SB having formed thereon the peripheral circuit CBA, and the support substrate having formed thereon the stacked body LM, are bonded (step S251). Thereafter, the support substrate is removed.

The semiconductor memory device 3 according to the second embodiment is thus manufactured.

Note that the order of processes illustrated in FIG. 12 is merely illustrative, and may be suitably modified. For example, the order of the process of step S212 and the process of step S213 is interchangeable, and also the order of the process of step S222 and the processes of steps S223 and S231 is interchangeable. Also the order of the process of step S241 and the process of step S242 may be interchanged.

According to the semiconductor memory device 3 of the second embodiment, effects same as those of the semiconductor memory device 1 of the first embodiment can be obtained.

Another Embodiment

In the aforementioned first and second embodiments, and the first to fifth modified examples, the slits ST after the replacement for forming the stacked body LM were designed to be filled with the conductive layer, to form the plate-like contacts LI that function as the source line contacts. Alternatively, the slits ST, having been subjected to the replacement for forming the stacked body LM, may be filled solely with an insulating layer or the like, to form a plate-like portion which does not function as the source line contact.

Meanwhile, in the first and second embodiments, and the first to fifth modified examples, the semiconductor memory device was designed to contain the stacked body LM having the two-tier structure. The stacked body of the semiconductor memory device may alternatively have a one-tier structure, or a structure with three or more tiers. With the increased number of tiers, the number of stacking of the word lines WL may further be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a stacked body in which a plurality of conductive layers and a plurality of insulating layers are alternately stacked one by one, and that includes a memory region and a staircase region arranged in a first direction that intersects a stacking direction of the plurality of conductive layers;
   a plate-like portion that extends in the stacked body in the stacking direction and in the first direction, and divides the stacked body in a second direction that intersects the stacking direction and the first direction;
   a first staircase portion that is arranged in the staircase region at a position that overlaps the plate-like portion in the stacking direction, in which the plurality of conductive layers is terraced in the first direction;
   a second staircase portion and a third staircase portion arranged in the staircase region on both sides in the second direction of the plate-like portion, and having structures in each of which the plurality of conductive layers is terraced, and that are mutually inverted in the second direction with respect to the plate-like portion;
   a plurality of first pillars arranged in the memory region on one side in the second direction of the plate-like portion and along the plate-like portion, and extending in the stacked body in the stacking direction;
   a plurality of second pillars arranged in the memory region on another side in the second direction of the plate-like portion and along the plate-like portion, and extending in the stacked body in the stacking direction;
   a plurality of first plugs arranged above the stacked body, and individually connected to the plurality of first pillars; and
   a plurality of second plugs arranged above the stacked body, and individually connected to the plurality of second pillars, wherein
   the plurality of first plugs is individually arranged at different positions in the second direction relative to the plate-like portion, depending on positions in the first direction, and
   the plurality of second plugs is individually arranged at positions inverted in the second direction from the respective positions of the plurality of first plugs, with respect to the plate-like portion.

2. The semiconductor memory device according to claim 1, wherein
   center positions in the second direction of the plurality of first plugs vary stepwise, depending on distances between each of the plurality of first plugs and the staircase region.

3. The semiconductor memory device according to claim 2, wherein
   the center positions of the plurality of the first plugs come closer to the plate-like portion as the positions of the plurality of the first plugs come closer to the staircase region.

4. The semiconductor memory device according to claim 1, wherein
   the plurality of first pillars is individually arranged at different positions in the second direction relative to the plate-like portion depending on positions in the first direction, and
   the plurality of second pillars is individually arranged at positions inverted in the second direction from the respective positions of the plurality of first pillars, with respect to the plate-like portion.

5. The semiconductor memory device according to claim 4, wherein
   center positions in the second direction of the plurality of first pillars vary stepwise depending on distances between each of the plurality of first pillars and the staircase region, and
   center positions in the second direction of the plurality of first plugs vary in accordance with the center positions of the plurality of first pillars.

6. The semiconductor memory device according to claim 5, wherein
   the center positions of the plurality of first plugs are substantially aligned with the center positions of the plurality of first pillars to be connected.

7. The semiconductor memory device according to claim 5, wherein
   the center positions of the plurality of first plugs deviate more largely from the center positions of the plurality of first pillars to be connected in a direction departing from the plate-like portion, as the positions of the plurality of first plugs come closer to the staircase region.

8. The semiconductor memory device according to claim 5, further comprising:
   a plurality of upper plugs arranged above the plurality of first plugs, and individually connected to the plurality of first plugs, wherein
   center positions in the second direction of the plurality of upper plugs vary in accordance with the center positions of the plurality of first plugs.

9. The semiconductor memory device according to claim 1, further comprising:
   a plurality of third pillars arranged in the memory region on the one side of the plate-like portion and along the plate-like portion, at positions more distant in the second direction away from the plate-like portion than the plurality of first pillars, and extending in the stacked body in the stacking direction; and
   a plurality of third plugs arranged above the stacked body, and individually connected to the plurality of third pillars, wherein
   the plurality of third plugs is individually arranged at different positions in the second direction relative to the plate-like portion, depending on positions in the first direction.

10. The semiconductor memory device according to claim 9, further comprising:
- a plurality of first upper plugs arranged above the plurality of first plugs, and individually connected to the plurality of first plugs while maintaining a substantially constant distance in the second direction from the plate-like portion;
- a plurality of second upper plugs arranged in a same layer as the plurality of first upper plugs, and arranged on the one side of the plate-like portion and along the plate-like portion, at positions closer to the plate-like portion than the plurality of first upper plugs, while maintaining a substantially constant distance in the second direction from the plate-like portion;
- a plurality of third upper plugs arranged above the plurality of third plugs, and individually connected to the plurality of third plugs while maintaining a substantially constant distance in the second direction from the plate-like portion; and
- a plurality of fourth upper plugs arranged in a same layer as the plurality of third upper plugs, and arranged on the one side of the plate-like portion and along the plate-like portion, at positions more distant away from the plate-like portion than the plurality of the third upper plugs, while maintaining a substantially constant distance in the second direction from the plate-like portion, wherein
- center positions in the second direction of the plurality of first upper plugs are distant, by a first distance, away from center positions in the second direction of the plurality of second upper plugs,
- center positions in the second direction of the plurality of third upper plugs are distant, by a second distance, away from center positions in the second direction of the plurality of fourth upper plugs,
- the center positions of the plurality of first upper plugs and the center positions of the plurality of third upper plugs are distant by a third distance which is longer than the first and second distances, and
- an amount of deviation of a center position in the second direction of one of the plurality of third plugs, from a center position in the second direction of one of the plurality of third pillars to which the one third plug is to be connected, is larger than an amount of deviation of a center position in the second direction of one of the plurality of first plugs neighboring the one third plug, from a center position in the second direction of one of the plurality of first pillars to which the one first plug is to be connected.

11. The semiconductor memory device according to claim 10, further comprising:
- a plurality of fourth pillars arranged in the memory region on the one side of the plate-like portion and along the plate-like portion, at positions more distant in the second direction away from the plate-like portion than the plurality of third pillars, and extending in the stacked body in the stacking direction; and
- a plurality of fourth plugs arranged above the stacked body, and individually connected to the plurality of fourth pillars, as well as individually connected to the plurality of fourth upper plugs, wherein
- the plurality of fourth plugs is individually arranged at different positions in the second direction relative to the plate-like portion, depending on positions in the first direction, and
- an amount of deviation of a center position in the second direction of one of the plurality of fourth plugs, from a center position in the second direction of one of the plurality of fourth pillars to which the one fourth plug is to be connected, is substantially equal to the amount of deviation of the center position of the one third plug, of the plurality of third plugs, neighboring the one fourth plug, from the center position of the one third pillar to which the one third plug is to be connected.

12. The semiconductor memory device according to claim 11, wherein
- center positions in the second direction of the plurality of third plugs more largely deviate in a direction departing from the plate-like portion from center positions in the second direction of the plurality of third pillars to be connected as the positions of the plurality of third plugs come closer to the staircase region, and
- center positions in the second direction of the plurality of fourth plugs more largely deviate in the direction departing from the plate-like portion from center positions in the second direction of the plurality of fourth pillars to be connected as the positions of the plurality of fourth plugs come closer to the staircase region.

13. The semiconductor memory device according to claim 12, further comprising:
- a plurality of fifth pillars arranged in the memory region on the one side of the plate-like portion and along the plate-like portion, at positions closer in the second direction to the plate-like portion than the plurality of first pillars, and extending in the stacked body in the stacking direction; and
- a plurality of fifth plugs arranged above the stacked body, and individually connected to the plurality of fifth pillars, as well as individually connected to the plurality of second upper plugs, wherein
- the plurality of fifth plugs is individually arranged at different positions in the second direction relative to the plate-like portion, depending on positions in the first direction,
- center positions in the second direction of the plurality of first plugs are substantially aligned with center positions in the second direction of the plurality of first pillars to be connected, and
- center positions in the second direction of the plurality of fifth plugs are substantially aligned with center positions in the second direction of the plurality of fifth pillars to be connected.

14. The semiconductor memory device according to claim 10, further comprising:
- a plurality of fourth pillars arranged in the memory region on the one side of the plate-like portion and along the plate-like portion, at positions more distant in the second direction away from the plate-like portion than the plurality of third pillars, and extending in the stacked body in the stacking direction; and
- a plurality of fourth plugs arranged above the stacked body, and individually connected to the plurality of fourth pillars, as well as individually connected to the plurality of fourth upper plugs, wherein
- the plurality of fourth plugs is individually arranged at different positions in the second direction relative to the plate-like portion, depending on positions in the first direction, and
- an amount of deviation of a center position in the second direction of one of the plurality of fourth plugs, from a center position in the second direction of one of the plurality of fourth pillars to which the one fourth plug is to be connected, is smaller than an amount of deviation of the center position of the one third plug, of the plurality of third plugs, neighboring the one fourth plug, from the center position of the one third pillar to which the one third plug is to be connected.

15. The semiconductor memory device according to claim 14, further comprising:
a plurality of fifth pillars arranged in the memory region on the one side of the plate-like portion and along the plate-like portion, at positions closer in the second direction to the plate-like portion than the plurality of first pillars, and extending in the stacked body in the stacking direction; and
a plurality of fifth plugs arranged above the stacked body, and individually connected to the plurality of fifth pillars, as well as individually connected to the plurality of second upper plugs, wherein
the plurality of fifth plugs is individually arranged at different positions in the second direction relative to the plate-like portion, depending on positions in the first direction,
center positions in the second direction of the plurality of first plugs more largely deviate in a direction departing from the plate-like portion from center positions in the second direction of the plurality of first pillars to be connected as the positions of the plurality of first plugs come closer to the staircase region, and
center positions in the second direction of the plurality of fifth plugs are substantially aligned with center positions in the second direction of the plurality of fifth pillars to be connected.

16. A semiconductor memory device comprising:
a stacked body in which a plurality of conductive layers and a plurality of insulating layers are alternately stacked one by one, and that includes a memory region and a staircase region arranged in a first direction that intersects a stacking direction of the plurality of conductive layers;
a plate-like portion that extends in the stacked body in the stacking direction and in the first direction, and divides the stacked body in a second direction that intersects the stacking direction and the first direction;
a first staircase portion that is arranged in the staircase region at a position that overlaps the plate-like portion in the stacking direction, in which the plurality of conductive layers is terraced in the first direction;
a second staircase portion and a third staircase portion arranged in the staircase region on both sides in the second direction of the plate-like portion, and having structures in each of which the plurality of conductive layers is terraced, and that are mutually inverted in the second direction with respect to the plate-like portion;
a plurality of first pillars arranged in the memory region on one side in the second direction of the plate-like portion and along the plate-like portion, and extending in the stacked body in the stacking direction;
a plurality of second pillars arranged in the memory region on another side in the second direction of the plate-like portion and along the plate-like portion, and extending in the stacked body in the stacking direction;
a plurality of first lower plugs arranged above the stacked body, and individually connected to the plurality of first pillars;
a plurality of second lower plugs arranged above the stacked body, and individually connected to the plurality of second pillars;
a plurality of first upper plugs arranged above the plurality of first lower plugs, and individually connected to the plurality of first lower plugs; and
a plurality of second upper plugs arranged above the plurality of second lower plugs, and individually connected to the plurality of second lower plugs, wherein
center positions in the second direction of the plurality of first lower plugs are individually arranged at different positions in the second direction relative to center positions in the second direction of the plurality of first upper plugs to be connected, and
the plurality of second lower plugs is individually arranged at positions inverted in the second direction from respective positions of the plurality of first lower plugs, with respect to the plate-like portion.

17. The semiconductor memory device according to claim 16, wherein
the center positions of the plurality of first lower plugs, relative to the center positions of the plurality of first upper plugs to be connected, vary stepwise depending on distances between each of the plurality of first lower plugs and the staircase region.

18. The semiconductor memory device according to claim 17, wherein
the center positions of the plurality of first lower plugs more largely deviate in a direction approaching the plate-like portion from the center positions of the plurality of first upper plugs to be connected as the positions of the plurality of first lower plugs come closer to the staircase region.

19. The semiconductor memory device according to claim 16, wherein
the plurality of first upper plugs is arranged along the plate-like portion, while maintaining a substantially constant distance in the second direction from the plate-like portion.

20. The semiconductor memory device according to claim 16, wherein
the staircase region is a recess including the first to third staircase portions arranged to form an outer periphery, an insulating film being filled in the recess at least up to a level of height of the stacked body.

* * * * *